(12) United States Patent
Chen et al.

(10) Patent No.: US 9,711,467 B2
(45) Date of Patent: *Jul. 18, 2017

(54) METHOD FOR MANUFACTURING A SEMICONDUCTOR COMPONENT HAVING A COMMON MODE FILTER MONOLITHICALLY INTEGRATED WITH A PROTECTION DEVICE

(71) Applicant: Semiconductor Components Industries, LLC, Phoenix, AZ (US)

(72) Inventors: Yupeng Chen, San Jose, CA (US); Rong Liu, San Jose, CA (US); Phillip Holland, Los Gatos, CA (US); Umesh Sharma, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/229,489

(22) Filed: Aug. 5, 2016

(65) Prior Publication Data

US 2016/0343676 A1    Nov. 24, 2016

Related U.S. Application Data

(62) Division of application No. 14/444,143, filed on Jul. 28, 2014, now Pat. No. 9,431,385.

(Continued)

(51) Int. Cl.
*H01L 21/8234* (2006.01)
*H01L 23/66* (2006.01)
(Continued)

(52) U.S. Cl.
CPC ........ *H01L 23/66* (2013.01); *H01L 21/30604* (2013.01); *H01L 21/768* (2013.01);
(Continued)

(58) Field of Classification Search
CPC ............. H01L 21/30604; H01L 21/768; H01L 21/8234; H01L 23/5227; H01L 23/528;
(Continued)

(56) References Cited

U.S. PATENT DOCUMENTS 4,953,002 A    8/1990 Nelson et al.
5,051,667 A    9/1991 Dunham
(Continued)

FOREIGN PATENT DOCUMENTS

JP     08203737      8/1996
JP     2002-101505   4/2002
JP     2006140229    6/2006

OTHER PUBLICATIONS

Sunderarajan S. Mohan, et al., Modeling and Characterization of On-Chip Transformers, IEEE, IEDM 98, Sep. 1998, 531-534.
(Continued)

*Primary Examiner* — Thanh T Nguyen
(74) *Attorney, Agent, or Firm* — Rennie William Dover

(57) ABSTRACT

In accordance with an embodiment, a semiconductor component, includes a common mode filter monolithically integrated with a protection device. The common mode filter includes a plurality of coils and the protection device has a terminal coupled to a first coil and another terminal coupled to a second coil.

17 Claims, 16 Drawing Sheets

Related U.S. Application Data

(60) Provisional application No. 61/864,247, filed on Aug. 9, 2013.

(51) Int. Cl.

| | | |
|---|---|---|
| *H01L 27/02* | (2006.01) | |
| *H01L 23/522* | (2006.01) | |
| *H01L 27/06* | (2006.01) | |
| *H01L 49/02* | (2006.01) | |
| *H01L 23/58* | (2006.01) | |
| *H01L 23/60* | (2006.01) | |
| *H01L 21/306* | (2006.01) | |
| *H01L 21/768* | (2006.01) | |
| *H01L 23/528* | (2006.01) | |
| *H01L 29/06* | (2006.01) | |
| *H01L 29/66* | (2006.01) | |
| *H03H 1/00* | (2006.01) | |
| *H01L 23/532* | (2006.01) | |
| *H01L 27/07* | (2006.01) | |
| *H03H 7/42* | (2006.01) | |

(52) U.S. Cl.
CPC ........ *H01L 21/8234* (2013.01); *H01L 23/528* (2013.01); *H01L 23/5227* (2013.01); *H01L 23/58* (2013.01); *H01L 23/60* (2013.01); *H01L 27/0248* (2013.01); *H01L 27/0255* (2013.01); *H01L 27/0288* (2013.01); *H01L 27/0629* (2013.01); *H01L 27/0676* (2013.01); *H01L 28/10* (2013.01); *H01L 28/40* (2013.01); *H01L 29/0649* (2013.01); *H01L 29/6609* (2013.01); *H03H 1/00* (2013.01); *H01L 23/53238* (2013.01); *H01L 27/0727* (2013.01); *H01L 2223/6638* (2013.01); *H01L 2223/6672* (2013.01); *H01L 2924/0002* (2013.01); *H03H 7/427* (2013.01); *H03H 2001/0064* (2013.01); *H03H 2001/0092* (2013.01)

(58) Field of Classification Search
CPC ........ H01L 23/58; H01L 23/60; H01L 23/66; H01L 27/0248; H01L 27/0255; H01L 27/0288; H01L 27/0292; H01L 27/0296; H01L 27/0629; H01L 27/0676; H01L 28/10; H01L 28/40; H01L 2223/6638; H01L 2223/6672; H01L 23/553238; H01L 27/0727; H01L 2924/0002; H03H 1/00; H03H 2001/0064; H03H 2001/0092; H03H 7/427

See application file for complete search history.

(56) References Cited

U.S. PATENT DOCUMENTS

| | | | |
|---|---|---|---|
| 6,114,937 A | 9/2000 | Burghartz et al. | |
| 6,396,032 B1 | 5/2002 | Denny et al. | |
| 6,833,627 B2 | 12/2004 | Farnworth | |
| 6,876,285 B2 | 4/2005 | Liang et al. | |
| 6,906,369 B2 | 6/2005 | Ross et al. | |
| 7,088,215 B1 | 8/2006 | Winter et al. | |
| 7,396,701 B2 | 7/2008 | Shigemura et al. | |
| 7,414,508 B2 | 8/2008 | Okuzawa et al. | |
| 7,547,992 B2 | 6/2009 | Hiyama | |
| 8,050,045 B2 | 11/2011 | Okuzawa et al. | |
| 8,063,480 B2 | 11/2011 | Mukaibara | |
| 8,514,596 B2 | 8/2013 | Koyama et al. | |
| 9,111,758 B2 * | 8/2015 | Chen | H01L 27/0255 |
| 2003/0086718 A1 | 5/2003 | Birumachi | |
| 2003/0205778 A1 | 11/2003 | Yeo et al. | |
| 2005/0258509 A1 | 11/2005 | Horikawa et al. | |
| 2005/0285262 A1 | 12/2005 | Knapp et al. | |
| 2006/0001520 A1 | 1/2006 | Kaji et al. | |
| 2006/0068602 A1 | 3/2006 | Kamijima | |
| 2007/0040163 A1 | 2/2007 | Okuzawa et al. | |
| 2007/0075819 A1 | 4/2007 | Okuzawa | |
| 2007/0200218 A1 | 8/2007 | Mukaibara | |
| 2008/0297964 A1 | 12/2008 | Hiyama | |
| 2010/0048985 A1 * | 2/2010 | Henke | A61B 5/02055 600/28 |
| 2010/0052838 A1 | 3/2010 | Matsuta et al. | |
| 2010/0148265 A1 * | 6/2010 | Lin | H01L 29/735 257/355 |
| 2010/0277256 A1 * | 11/2010 | Concord | H01P 1/2007 333/177 |
| 2013/0001694 A1 * | 1/2013 | Guan | H01L 27/0255 257/355 |
| 2013/0147419 A1 | 6/2013 | Sakai et al. | |

OTHER PUBLICATIONS

On Semiconductor, NUC2401MN Integrated Common Mode Choke with Integrated ESD Protection, Mar. 2009—Rev. 0. www.onsemi.com.

On Semiconductor, NUC2401MN Integrated Common Mode Choke with Integrated ESD Protection, May 2009—Rev. 1. www.onsemi.com.

On Semiconductor, On Semiconductor Introduces Industry's First Common Mode Choke EMI Filter with Integrated ESD Protection for High-Speed Data Lines, Press Release Phoenix, Arizona, May 27, 2009, www.onsemi.com.

On Semiconductor, On Semiconductor Introduces Industry's First Common Mode Choke EMI Filter with Integrated ESD Protection for High-Speed Data Lines, Press Release May 27, 2009, www.businesswire.com.

On Semiconductor, On Semiconductor Introduces Industry's First Common Mode Choke EMI Filter with Integrated ESD Protection for High-Speed Data Lines, Press Release May 27, 2009, www.tradingmarkets.com.

On Semiconductor, On Semiconductor Introduces Industry's First Common Mode Choke EMI Filter with Integrated ESD Protection for High-Speed Data Lines, Press Release Jun. 1, 2009. http://www.ctimes.com.tw/DispProduct/en/EMI-filter/ON-Semiconductor/0906012227CS.shtml.

Common mode filter with ESD protection for USB 2.0 and MIPI D-PHY/MDDI interface, Doc ID 17815 Rev 2, Jun. 2011, pp. 1-15, www.st.com.

On Semiconductor, Single Pair Common Mode Filter with ESD Protection, Publication Order No. EMI2121MT/D, Apr. 2013—Rev 2, pp. 1-9, www.onsemi.com.

\* cited by examiner

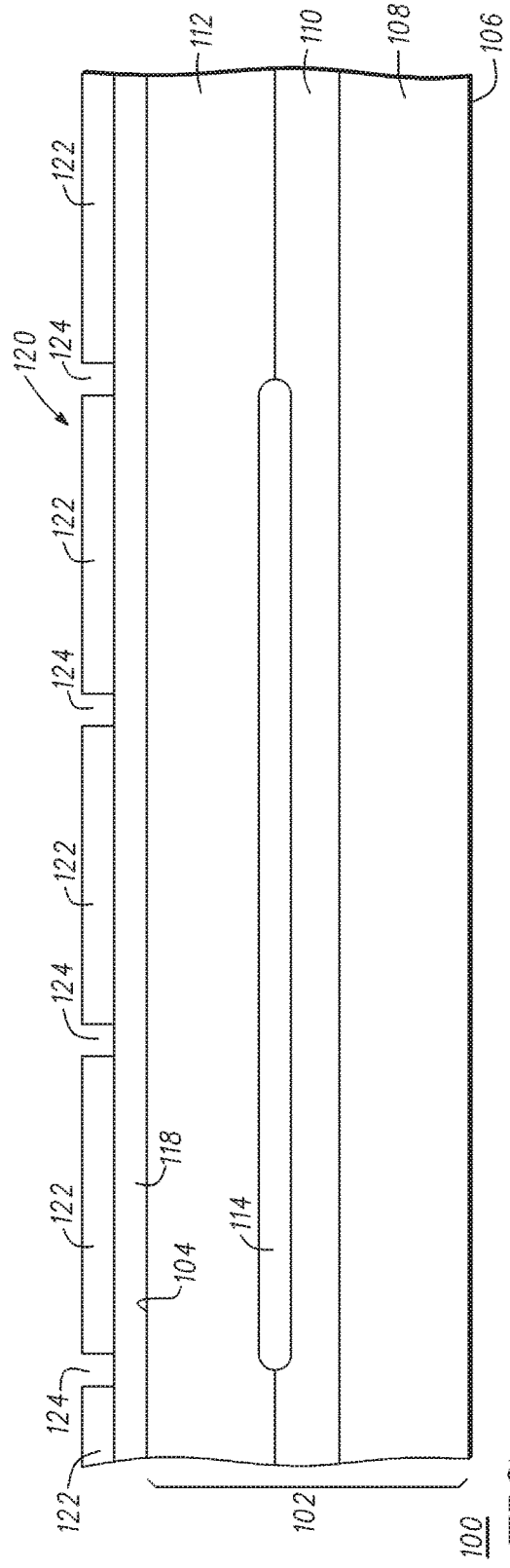
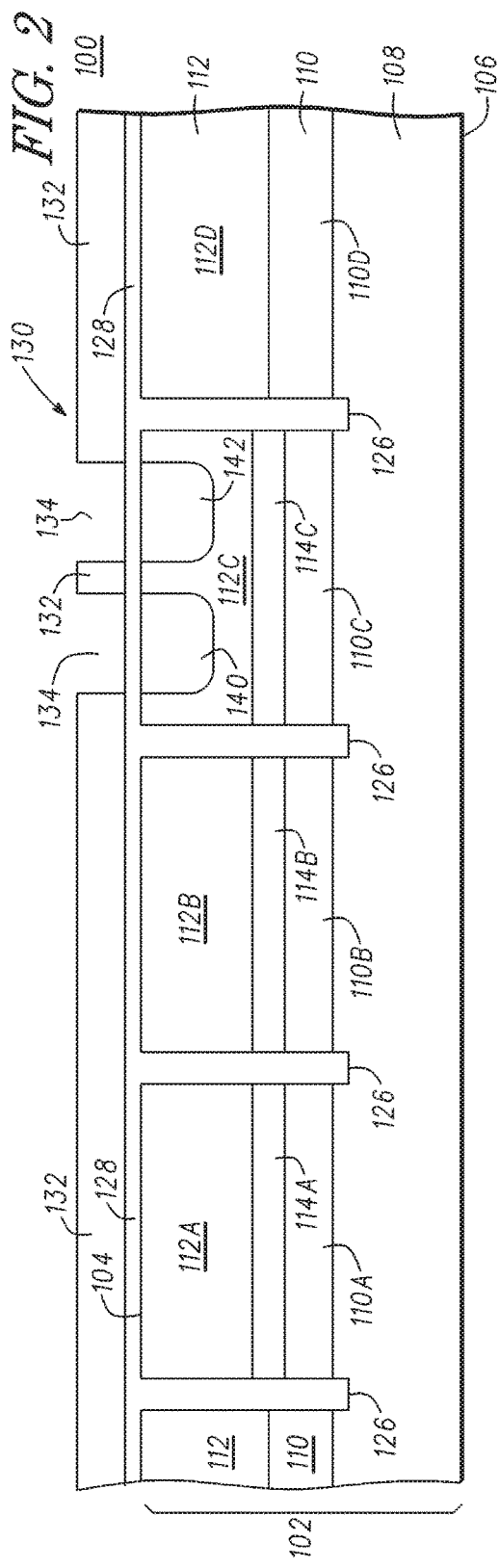

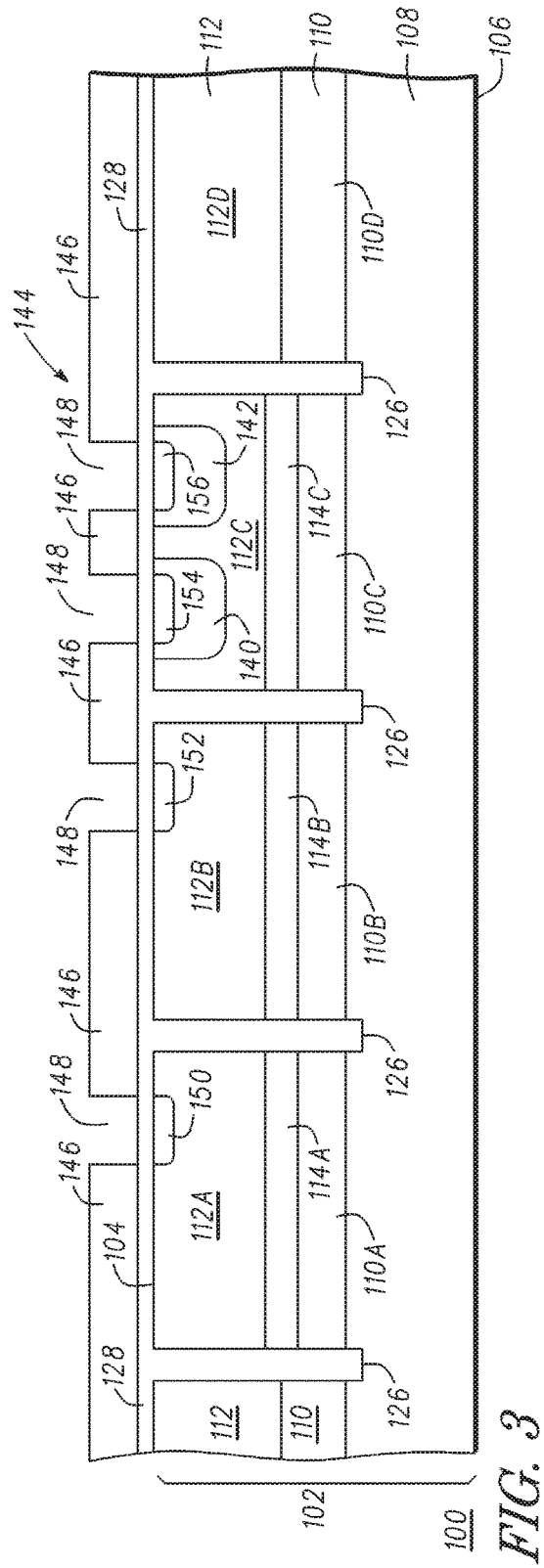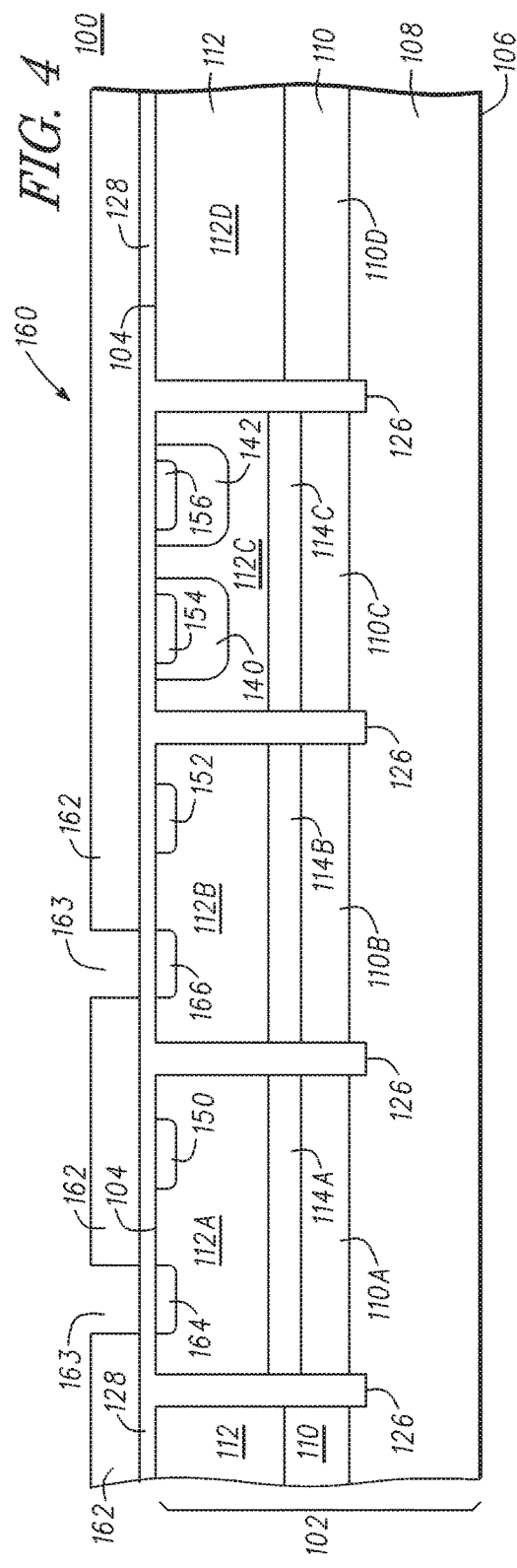

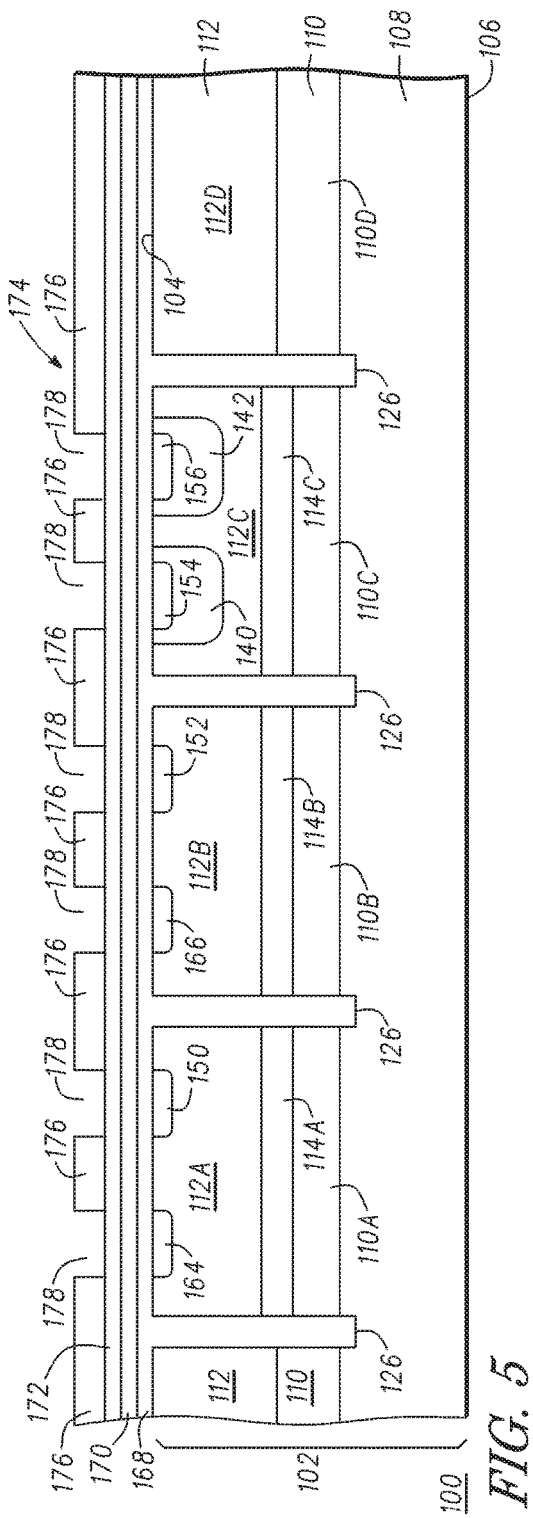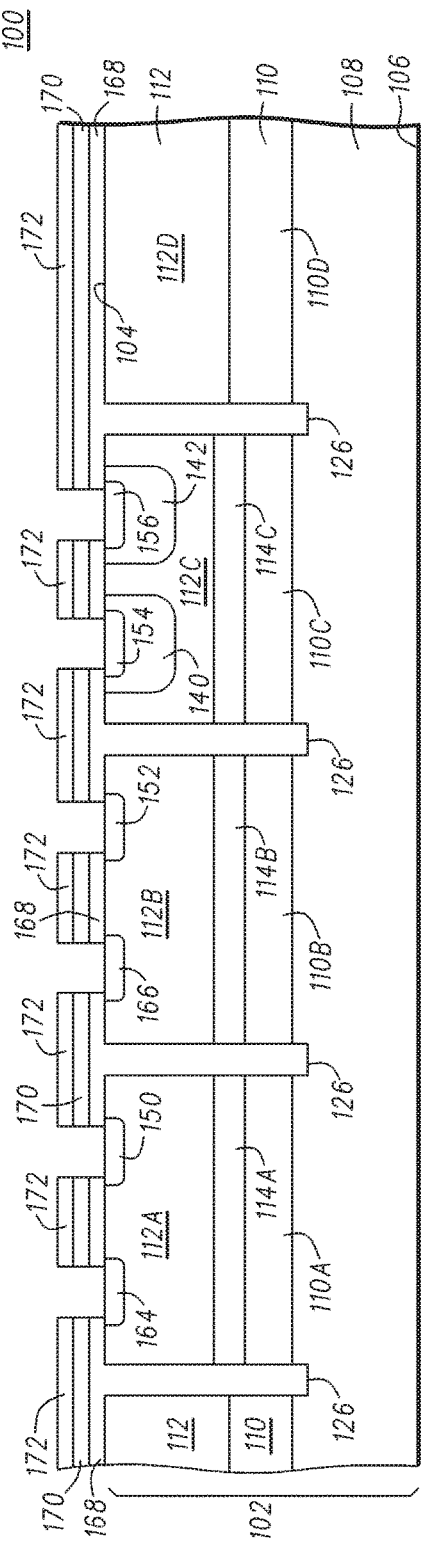

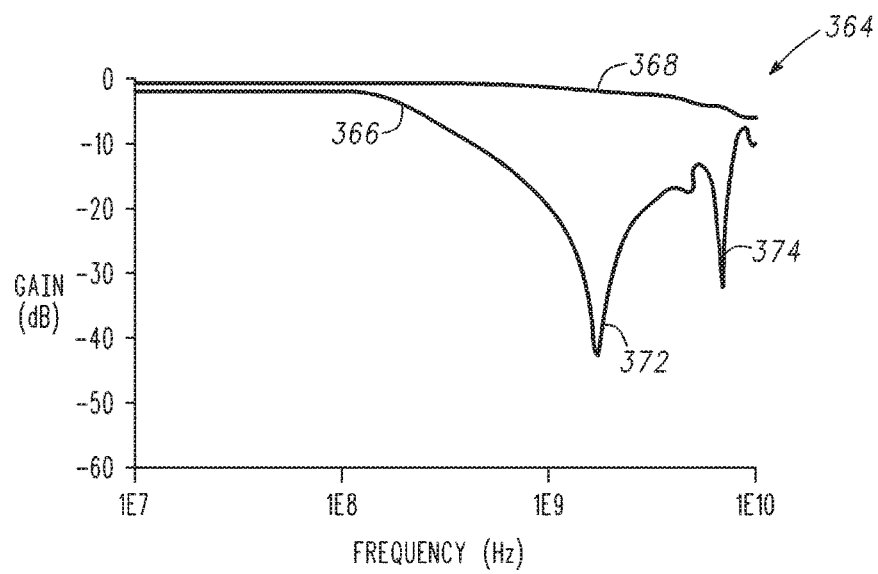
FIG. 23
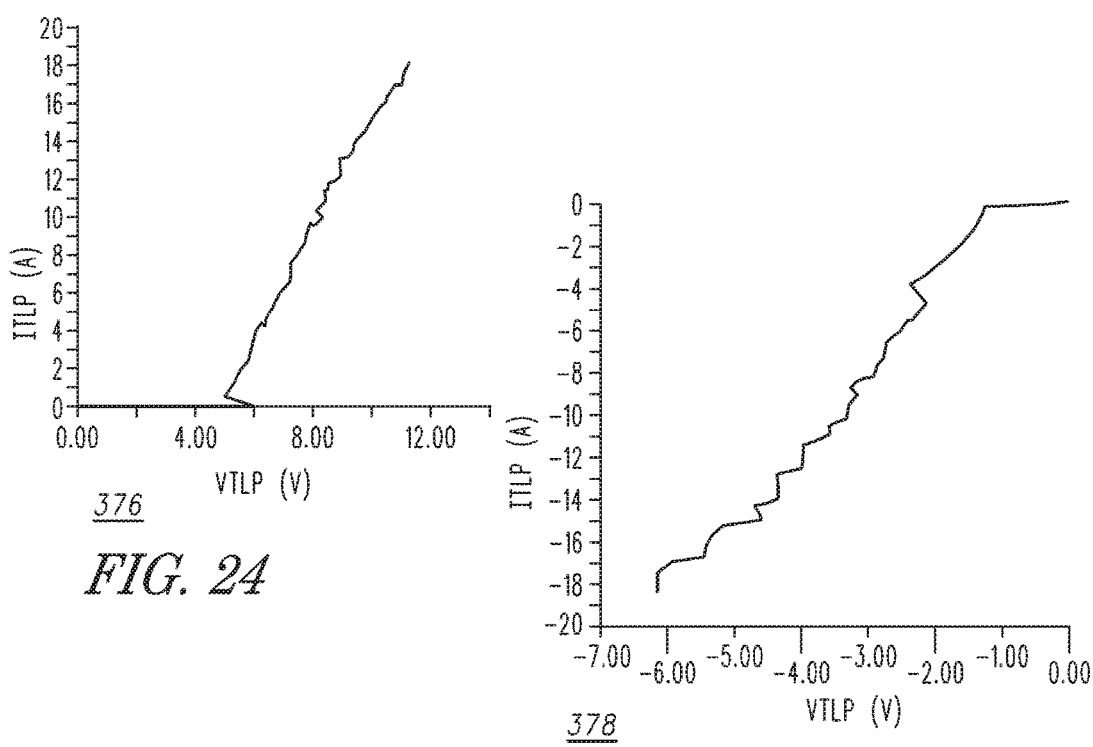
FIG. 24
FIG. 25

METHOD FOR MANUFACTURING A SEMICONDUCTOR COMPONENT HAVING A COMMON MODE FILTER MONOLITHICALLY INTEGRATED WITH A PROTECTION DEVICE

The present application is a divisional application of U.S. patent application Ser. No. 14/444,143 filed on Jul. 28, 2014, by Yupeng Chen et al., titled "SEMICONDUCTOR COMPONENT THAT INCLUDES A COMMON MODE FILTER AND METHOD OF MANUFACTURING THE SEMICONDUCTOR COMPONENT," which is a nonprovisional application of U.S. Patent Application No. 61/864,247, filed on Aug. 9, 2013, by Yupeng Chen et al., titled "SEMICONDUCTOR COMPONENT AND METHOD OF MANUFACTURE" which is hereby incorporated by reference in its entirety, and priority thereto for common subject matter is hereby claimed.

TECHNICAL FIELD

The present invention relates, in general, to semiconductor components and, more particularly, to signal transmission in semiconductor components.

BACKGROUND

Transmission protocols within communications systems may include the use of single-ended signals, differential signals, or combinations of single-ended and differential signals. For example, single-ended signals and differential signals are suitable for use in portable communications systems that employ low speed data transmission. However, in communications systems that employ high speed data transmission, it is desirable to use differential signals because of their noise immunity properties. These types of systems include mobile electronic devices such as, for example, smartphones, tablets, computers, and systems that include Universal Serial Bus (USB) applications. In addition to noise immunity, it is desirable to include protection from large transient voltage and current spikes, which can damage these systems. Typically, noise filters, also known as Common Mode Filters (CMF) and Electro-Static Discharge (ESD) protection circuits are mounted to a Printed Circuit Board (PCB) along with other circuitry of the communications system to reduce common mode noise on differential signal lines and to suppress large transient electrical spikes, respectively. This configuration of elements occupies a large area on a PCB, which is disadvantageous in mobile electronic devices. The ESD protection circuits are fabricated from low resistivity substrates to accommodate high currents encountered during ESD events. It is undesirable to manufacture filter elements such as inductor coils on a low resistivity substrate because of the presence of eddy currents which degrade filter performance.

Accordingly, it would be advantageous to have a structure and method for manufacturing a semiconductor component that provides protection from large electrical transients and provides noise filtering. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which:

FIG. 1 is a cross-sectional view of a semiconductor component at an early stage of manufacture in accordance with an embodiment of the present invention;

FIG. 2 is a cross-sectional view of the semiconductor component of FIG. 1 at a later stage of manufacture;

FIG. 3 is a cross-sectional view of the semiconductor component of FIG. 2 at a later stage of manufacture;

FIG. 4 is a cross-sectional view of the semiconductor component of FIG. 3 at a later stage of manufacture;

FIG. 5 is a is a cross-sectional view of the semiconductor component of FIG. 4 at a later stage of manufacture;

FIG. 6 is a cross-sectional view of the semiconductor component of FIG. 5 at a later stage of manufacture;

FIG. 23 plot of the common mode and differential mode performance of a semiconductor component in accordance with an embodiment of the present invention;

FIG. 24 is a plot of the ElectroStatic Discharge clamping performance in a positive direction of a semiconductor component in accordance with an embodiment of the present invention; and FIG. 25 is a plot of the ElectroStatic Discharge clamping performance in a negative direction of a semiconductor component in accordance with an embodiment of the present invention.

For simplicity and clarity of illustration, elements in the figures are not necessarily to scale, and the same reference characters in different figures denote the same elements.

Figure 7:
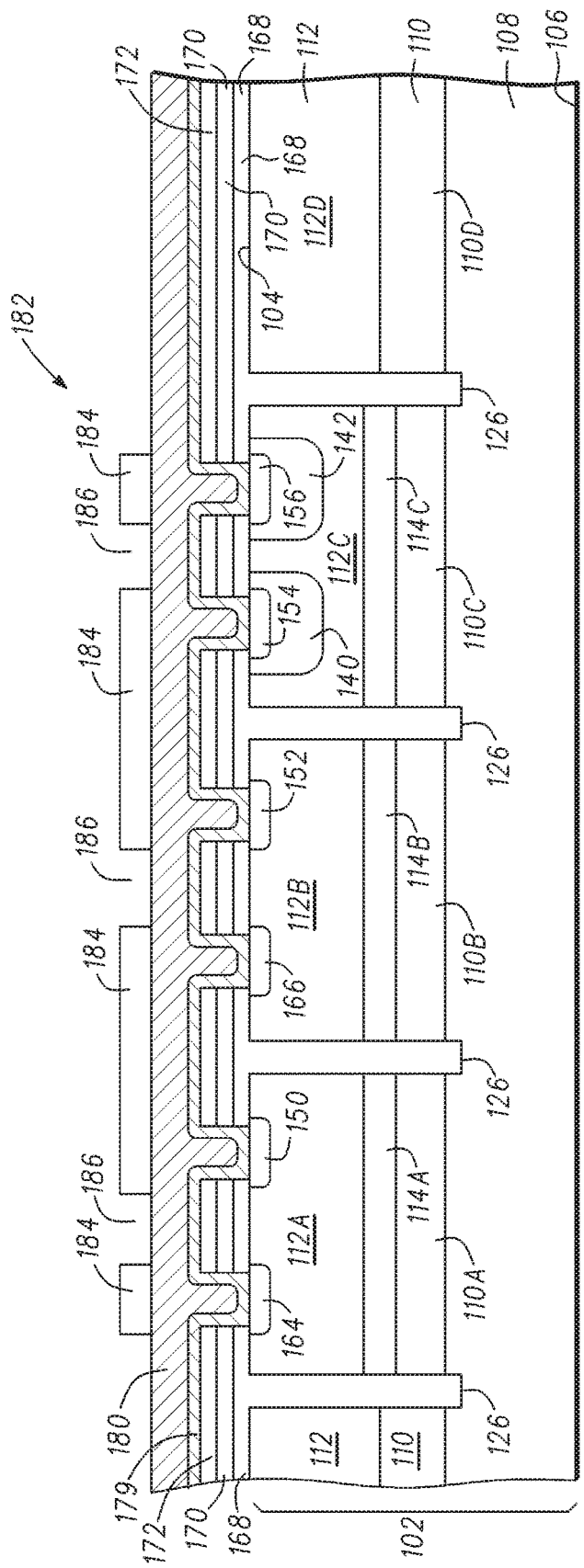
FIG. 7 is a cross-sectional view of the semiconductor component of FIG. 6 at a later stage of manufacture.

Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten per cent (10%) (and up to twenty percent (20%) for semiconductor doping concentrations) are regarded as reasonable variances from the ideal goal of exactly as described.

DETAILED DESCRIPTION

Generally, the present invention provides a semiconductor component comprising a common mode filter monolithically integrated with a protection device and a method for manufacturing the semiconductor component wherein the common mode filter comprises a first coil having first and second terminals; a second coil having first and second terminals, the first terminal of the second coil coupled to the first terminal of the first coil, the first coil magnetically coupled to the second coil; and the protection device having a first terminal coupled to the first terminal of the first coil and a second terminal coupled to the first terminal of the second coil.

In accordance with an embodiment, the protection device comprises a first diode having an anode and a cathode, the cathode coupled to the first terminal of the first coil and a second diode having an anode and a cathode, the anodes of the first and second diodes coupled together and the cathode of the second diode coupled to the first terminal of the second coil.

In accordance with another embodiment, the protection device further comprises a first capacitor coupled between the first terminal and the second terminal of the first coil and a second capacitor coupled between the first terminal and the second terminal of the second coil.

In accordance with another embodiment, a protection device comprises a first diode having an anode and a cathode and a second diode having an anode and a cathode, the cathode of the first diode coupled to the first terminal of the first coil, the cathode of the second diode coupled to the anode of the first diode.

In accordance with another embodiment, the semiconductor component further includes a transistor having a control electrode and first and second current carrying electrodes, the first current carrying electrode coupled to the cathode of the first diode and the second current carrying electrode coupled to the anode of the second diode.

In accordance with another embodiment, a protection device further comprises a third diode having an anode and a cathode, the anode of the third diode coupled to the anode of the second diode and a fourth diode having an anode and a cathode, the anode of the fourth diode coupled to cathode of the third diode and to the first terminal of the second coil.

In accordance with another embodiment, the semiconductor component further includes a first transistor having a control electrode and first and second current carrying electrodes, the first current carrying electrode coupled to the cathode of the first diode and the second current carrying electrode coupled to the anode of the second diode and to the anode of the third diode and a second transistor having a control electrode and first and second current carrying electrodes, the first current carrying electrode of the second transistor coupled to the second current carrying electrode of the first transistor, and the second current carrying electrode of the second transistor coupled to the anode of the fourth diode.

In accordance with another embodiment, a method for manufacturing a semiconductor component having a common mode filter monolithically integrated with a protection device, comprising: providing a semiconductor material having a major surface and a resistivity of at least 5 ohm-centimeters; forming a plurality of trenches in the semiconductor material; forming the protection device from the semiconductor material between first and second trenches of the plurality of trenches; and monolithically integrating a common mode filter with the protection device.

In accordance with another embodiment, providing the semiconductor material comprises: providing a semiconductor substrate having a resistivity of at least 10 ohm-centimeters; forming a first epitaxial layer of a first conductivity type over the semiconductor substrate; and forming a second epitaxial layer of a second conductivity type over the first epitaxial layer.

In accordance with another embodiment, the method further includes forming a buried layer of the first conductivity type from portions of the first and second epitaxial layers.

In accordance with another embodiment, forming the plurality of trenches includes forming at least first, second, third, and fourth trenches, wherein a portion of the semiconductor material between the first and second trenches serves as a first device region, a portion of the semiconductor material between the second and third trenches serves as a second device region, and a portion of the semiconductor material between the third and fourth trenches serves as a third device region.

In accordance with another embodiment, the method further includes forming a first diode from the first device region, a second diode from the second device region, and a transistor from the third device region.

In accordance with another embodiment, the method further includes forming a first and second dopant regions of the second conductivity type in the third device region; forming third and fourth dopant regions of the second conductivity type in the first and second dopant regions and fifth and sixth dopant regions of the second conductivity type in the first and second device regions, respectively; and forming seventh and eighth dopant regions of the first conductivity type in the first and second device regions, respectively.

In accordance with another embodiment, the method further includes forming a first dielectric layer over the semiconductor material, the first dielectric layer configured to magnetically decouple the common mode filter from the protection structure; forming a first coil of the common mode filter over the first dielectric layer; forming a second dielectric layer over the first coil and the first dielectric layer; and forming a second coil over the second dielectric layer, the second dielectric layer configured to magnetically coupled the first coil and the second coil.

In accordance with another embodiment, the method further includes forming a third layer of dielectric material over the second coil and the second layer of dielectric material.

In accordance with another embodiment, the first, second, and third layers of dielectric material are photosensitive polyimides.

In accordance with another embodiment, a semiconductor component that includes a common mode filter monolithically integrated with a protection device, the semiconductor component is provided that comprises: a semiconductor material having a peripheral region, a central region, and a resistivity of at least 5 ohm-centimeters, wherein the central region comprises a plurality of device regions isolated by isolation trenches; a first coil over a first portion of the central region; a second coil over a second portion of the central region; a first insulating material over the first and second coils; and a protection device monolithically integrated with the first and second coils, the protection device having a first terminal coupled to the first coil and a second terminal coupled to the second coil.

In accordance with another embodiment, the semiconductor material comprises an epitaxial layer formed on a semiconductor substrate, and the semiconductor component further comprises: a first metallization system over portions of the epitaxial layer; a first layer of dielectric material over the first metallization system; the first coil over the first layer of dielectric material, the first coil having coil elements; a second layer of dielectric material over the first coil; and the second coil over the first layer of dielectric material, the coil elements of the second coil laterally offset from the coil elements of the first coil.

In accordance with another embodiment, the first layer of dielectric material and the second layer of dielectric material are photosensitive polyimide.

In accordance with another embodiment, the semiconductor component further includes a first contact structure extending through the first layer of dielectric material, through the second layer of dielectric material and in contact with a portion of the first metallization system.

FIG. 1 is a cross-sectional view of a portion of a semiconductor component 100 such as, for example, a common mode filter monolithically integrated with Electrostatic Discharge (ESD) protection devices, during manufacture in accordance with an embodiment of the present invention. What is shown in FIG. 1 is a semiconductor material 102 having opposing surfaces 104 and 106. Surface 104 is also referred to as a front or top surface and surface 106 is also referred to as a bottom or back surface. In accordance with this embodiment, semiconductor material 102 comprises a semiconductor substrate 108 doped with an impurity material of p-type conductivity and having a resistivity of at least about 100 Ohm-centimeter (Ω-cm). Preferably, the resistivity of substrate 108 is 100 Ω-cm. More preferably, the resistivity of substrate 108 is 500 Ω-cm or more, and even more preferably the resistivity of substrate 108 is 1,000 Ω-cm or more. Suitable materials for substrate 108 include silicon and compound semiconductor materials such as, for example, gallium nitride, gallium arsenide, indium phosphide, Group III-V semiconductor materials, Group II-VI semiconductor materials, or the like.

In accordance with an embodiment, semiconductor material 102 further comprises an epitaxial layer 110 of n-type conductivity formed on high resistivity substrate 108 and an epitaxial layer 112 of p-type conductivity formed on epitaxial layer 110. A buried layer 114 is formed in a portion of epitaxial layers 110 and 112.

It should be noted that a region or layer doped with an n-type dopant or impurity material is said to be of an n-type conductivity or an n conductivity type and a region or layer doped with a p-type dopant or impurity material is said to be of a p-type conductivity or a p conductivity type.

A layer of dielectric material 118 is formed on or from semiconductor material 102. In accordance with an embodiment, the material of dielectric layer 118 is silicon dioxide having a thickness ranging from about 1,000 Angstroms (Å) to about 10,000 Å. Techniques for forming silicon dioxide layer 118 are known to those skilled in the art. For example, dielectric layer 118 may be formed by oxidizing semiconductor material 102 or it may be a TEOS layer formed using plasma enhanced chemical vapor deposition. Still referring to FIG. 1, a layer of photoresist is patterned over dielectric layer 118 to form a masking structure 120 having masking elements 122 and openings 124 that expose portions of dielectric layer 118.

Referring now to FIG. 2, the portions of dielectric layer 118 unprotected by masking elements 122 are removed using a wet etch that selectively etches the material of dielectric layer 118. Trenches 126 are formed through the portions semiconductor material 102 that are exposed by the removal of the portions of dielectric layer 118. In accordance with an embodiment, trenches 126 extend from surface 104 through epitaxial layer 112, buried layer 114, epitaxial layer 110 and into semiconductor substrate 108. Alternatively, trenches 126 terminate before reaching semiconductor substrate 108. Trenches 126 create epitaxial regions 112A, 112B, 112C, and 112D from epitaxial layer 112, epitaxial regions 110A, 110B, 110C, and 110D from epitaxial layer 110, and buried layer regions 114A, 114B, and 114C from buried layer 114.

Still referring to FIG. 2, masking elements 122 and any oxide, including dielectric layer 118, are removed and a dielectric layer 128 is formed on the exposed portions of epitaxial layer 112 including epitaxial regions 112A, 112B, 112C, and 112D and on trenches 126. By way of example dielectric layer 128 is oxide having a thickness above surface 104 ranging from 150 Å to about 400 Å, which oxide may be referred to as a pad oxide. It should be noted that a pad oxide may be referred to as a screen oxide. A layer of photoresist is patterned over dielectric layer 128 to form a masking structure 130 having masking elements 132 and openings 134 that expose portions of dielectric layer 128 over epitaxial region 112C.

P-type dopant regions 140 and 142 are formed in epitaxial region 112C by implanting an impurity material of p-type conductivity through the exposed portions of dielectric layer 128 and into epitaxial region 112C. P-type dopant regions 140 and 142 may be formed by implanting the impurity material into epitaxial region 112C at a dose ranging from about $5\times10^{12}$ atoms per square centimeter (atoms/cm$^2$) to about $1\times10^{14}$ atoms/cm$^2$ and an implant energy ranging from about 25 kilo-electronVolts (keV) to about 50 keV.

Referring now to FIG. 3, masking elements 132 are removed and the p-type dopant or impurity materials are driven into epitaxial region 112C by placing semiconductor material 102 in an inert ambient environment at a temperature ranging from about 1,000° C. to about 1,250° C. for a time ranging from about 2.5 hours to about 3.5 hours. By way of example, p-type dopant regions 140 and 142 are formed by implanting the p-type impurity material at a dose of about $2\times10^{13}$ atoms/cm$^2$ and an implant energy of about 35 keV and driving the dopant into semiconductor material 102 for about 3 hours in a nitrogen ambient environment at a temperature of about 1,150° C. Suitable p-type dopants or impurity materials include boron, indium, or the like. It should be noted that p-type dopant regions 140 and 142 are within epitaxial region 112C and that they are laterally spaced apart from each other.

Still referring to FIG. 3, a layer of photoresist is patterned over dielectric layer 128 to form a masking structure 144 having masking elements 146 and openings 148 that expose portions of dielectric layer 128 over epitaxial regions 112A, 112B, and 112C. An n-type dopant region 150 is formed in epitaxial region 112A, an n-type dopant region 152 is formed in epitaxial region 112B, and n-type dopant regions 154 and 156 are formed in p-type dopant regions 140 and 142, respectively, by implanting an impurity material of n-type conductivity through dielectric layer 128 and into epitaxial regions 112A, 112B, and 112C. N-type dopant regions 150, 152, 154, and 156 may be formed by implanting the impurity material through the exposed portions of dielectric layer 128 and into epitaxial regions 112A, 112B, and 112C at a dose ranging from about $5\times10^{12}$ atoms/cm$^2$ to about $1\times10^{14}$ atoms/cm$^2$ and an implant energy ranging from about 25 keV to about 50 keV.

Referring now to FIG. 4, masking elements 146 are removed and a layer of photoresist is patterned over dielectric layer 128 to form a masking structure 160 having masking elements 162 and openings 163 that expose portions of dielectric layer 128 over epitaxial regions 112A and 112B. A p-type dopant region 164 is formed in epitaxial region 112A and a p-type dopant region 166 is formed in epitaxial region 112B by implanting an impurity material of p-type conductivity through the exposed portions of dielectric layer 128 and into epitaxial regions 112A and 112B. P-type dopant regions 164 and 166 may be formed by implanting the impurity material into epitaxial regions 112A and 112B at a dose ranging from about $5\times10^{12}$ atoms/cm$^2$ to about $1\times10^{14}$ atoms/cm$^2$ and an implant energy ranging from about 25 keV to about 40 keV. By way of example, p-type dopant regions 164 and 166 are formed by implanting the p-type impurity material at a dose of $2\times10^{13}$ atoms/cm$^2$ and an implant energy of about 35 keV and driving the dopant into epitaxial regions 112A and 112B for about 3 hours in a nitrogen ambient environment at a temperature of about 1,150° C. Driving in the impurity material also anneals semiconductor material 102. Suitable p-type dopants or impurity materials include boron, indium, or the like. It should be noted that p-type dopant regions 164 and 166 are laterally spaced apart from n-type dopant regions 150 and 152, respectively.

Referring now to FIG. 5, masking elements 162 are removed and any dielectric material including dielectric layer 128 are removed and a layer of dielectric material 168 is formed on semiconductor substrate 102 and over trenches 126. A layer of dielectric material 170 is formed on dielectric layer 168 and a layer of dielectric material 172 is formed on dielectric layer 168. Dielectric layer 168 may be formed by oxidation and may have a thickness ranging from about 100 Å to about 500 Å, dielectric layer 170 may be an undoped silicon glass formed by plasma enhanced chemical vapor deposition and may have a thickness ranging from about 1,000 Å to about 3,000 Å, and dielectric layer 172 may be borophosphosilicate glass formed by plasma enhanced chemical vapor deposition and may have a thickness ranging from about 5,000 Å to about 10,000 Å. By way of example, dielectric layer 168 has a thickness of about 140 Å, dielectric layer 170 has a thickness of about 1,300 Å, and dielectric layer 172 has a thickness of about 6,000 Å. A reflow cycle is performed at a temperature ranging from about 900° C. to about 1,000° C. to planarize dielectric layer 172 and to activate the dopants of dopant regions 150, 152, 154, 156, 164, and 166. By way of example, the reflow cycle is at about 950° C. It should be noted that the thicknesses and methods of forming dielectric layers 168, 170, and 172 are not limitations of the present invention.

Still referring to FIG. 5, a layer of photoresist is patterned over dielectric layer 172 to form a masking structure 174 having masking elements 176 and openings 178 that expose portions of dielectric layer 172.

Referring now to FIG. 6, the portions of dielectric layer 172 exposed by openings 178 and the portions of dielectric layers 170 and 168 unprotected by masking elements 176 are removed using, for example, a wet etch technique. Removing the portions of dielectric layers 172, 170, and 168 exposes portions of dopant regions 150, 152, 154, 156, 164, and 166. Masking elements 176 are removed and a layer of refractory metal (not shown) is deposited over dielectric layer 172 and the exposed portions of dopant regions 150, 152, 154, 156, 164, and 166. By way of example, the refractory metal is titanium having a thickness ranging from about 100 Å to about 1,000 Å. A rapid thermal anneal is performed wherein the refractory metal is heated to a temperature ranging from about 500° C. to about 700° C. The heat treatment causes the titanium to react with the silicon to form titanium silicide in all regions in which the titanium is in contact with silicon or polysilicon. Alternatively, the refractory metal can be titanium nitride, tungsten, cobalt, or the like. The silicide formed by the rapid thermal anneal serves as a barrier layer.

Referring now to FIG. 7, a barrier metal 179 may be formed over dielectric layer 172 and the exposed portions of dopant regions 150, 152, 154, 156, 164, and 166. It should be noted that barrier metal 179 may be comprised of a plurality of metal layers, however they are shown as a single layer for the sake of clarity. A layer of aluminum copper (AlCu) 180 is formed over barrier metal layer 179. By way of example, aluminum copper layer 180 is sputtered onto barrier metal layer 179 and has a thickness ranging from about 1 micrometer (μm) to about 4 μm. Alternatively, layer 180 may be aluminum, aluminum copper silicon, aluminum silicon, or the like. A layer of photoresist is patterned over aluminum copper silicon layer 180 to form a masking structure 182 having masking elements 184 and openings 186 that expose portions of aluminum copper silicon layer 180.

Figure 8:
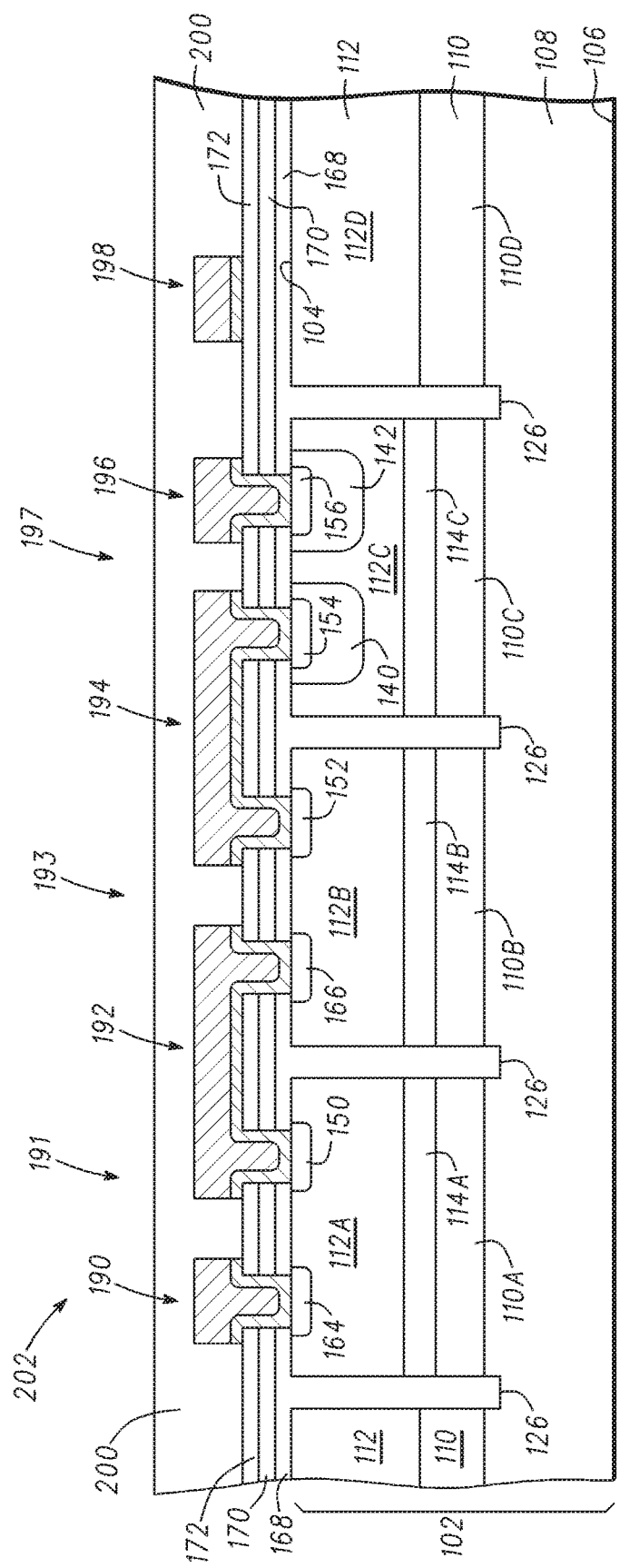
FIG. 8 is a cross-sectional view of the semiconductor component of FIG. 7 at a later stage of manufacture.
Figure 20:
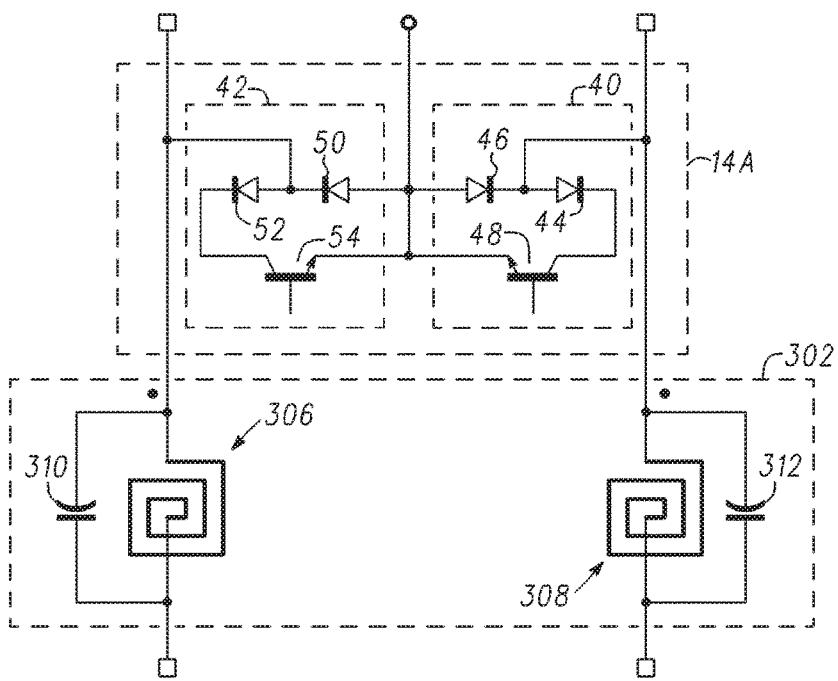
FIG. 20 is a circuit schematic of a semiconductor component in accordance with another embodiment of the present invention.

Referring now to FIG. 8, the exposed portions of aluminum copper silicon layer 180 are removed using a metal etching process that leaves contacts 190, 192, 194, and 196. Layer 180 may be etched using a plasma etch or a wet etch. Contact 190 serves as an anode contact for a diode 191 and contact 192 serves as a cathode contact for diode 191 and an anode contact for a diode 193, contact 194 serves as an anode contact for diode 193 and as a collector contact for a bipolar transistor 197, and contact 196 serves as an emitter contact of bipolar transistor 197. It should be noted that dopant region 164 forms the anode of diode 191, dopant region 150 forms the cathode of diode 191, dopant region 166 forms the anode of diode 193, dopant region 152 forms the cathode of diode 193, dopant region 154 forms the collector of bipolar transistor 197, and dopant region 156 forms the emitter of bipolar transistor 197. Contacts 190 and 192 may serve as connection contacts to make connections between the common mode filter and other circuit elements. By way of example, diode 191 is analogous to diodes 46 or 50 of FIG. 20, diode 193 is analogous to diodes 44 or 52 of FIG. 20, and bipolar transistor 194 is analogous to transistors 48 or 54 of FIG. 20. It should be noted that the anode of diode 50 is connected to the emitter of transistor 54; and that this connection is shown in FIG. 20, but not in the corresponding cross-sectional figures. This connection made using, for example an AlCu metal layer that is not shown in the corresponding cross-sectional figures.

Still referring to FIG. 8, a passivation layer 200 is formed on electrodes 190-196 and on the exposed portions of dielectric layer 172. By way of example, passivation layer 200 comprises a layer of silicon nitride having a thickness of about 7 kÅ. Alternatively, passivation layer 200 may be comprised of another suitable dielectric material or multiple layers of dielectric material.

Figure 9:
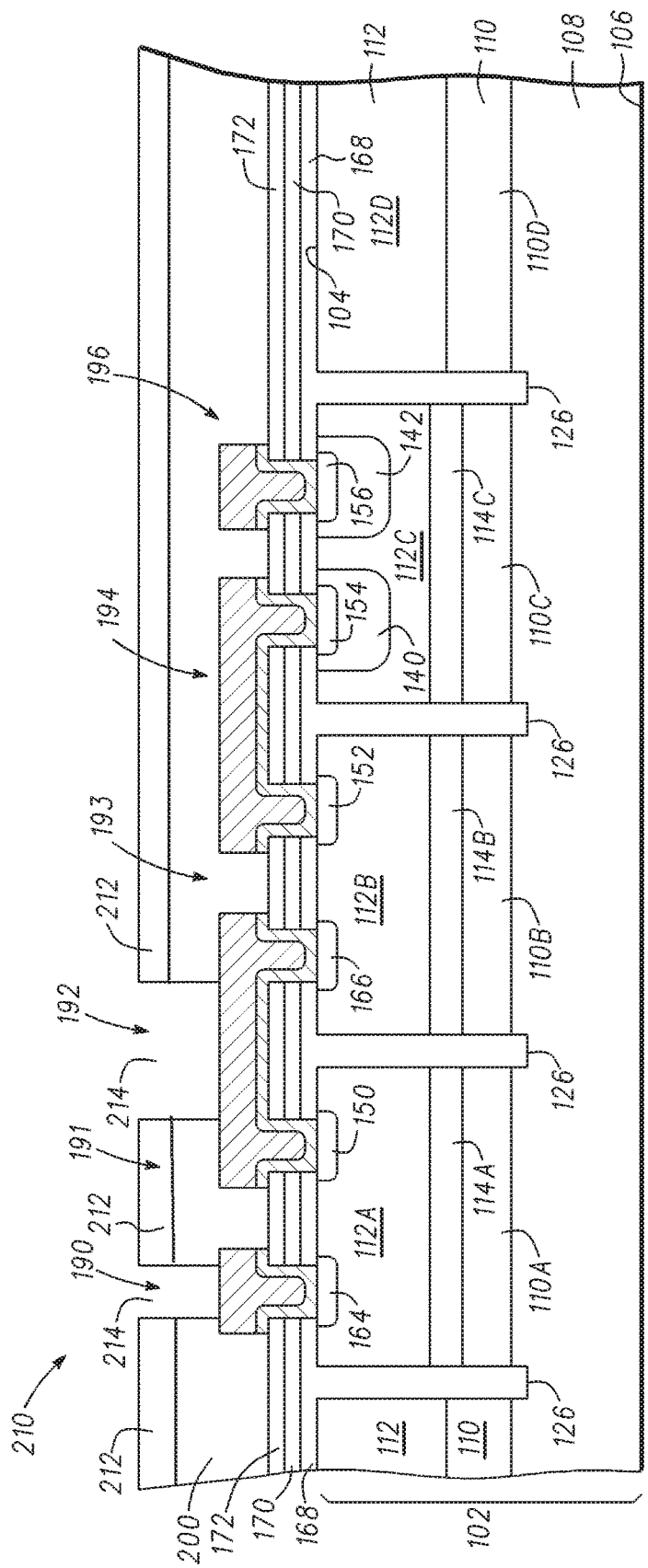
FIG. 9 is a cross-sectional view of the semiconductor component of FIG. 8 at a later stage of manufacture.

Referring now to FIG. 9, a layer of photoresist is patterned over passivation layer 200 to form a masking structure 210 having masking elements 212 and openings 214 that expose portions of dielectric layer 208 over contacts 190 and 192. The portions of dielectric layer 208 exposed by openings 214 and the portions of passivation layer 200 exposed by openings 214 are removed using, for example, a wet etch technique. Removing the exposed portions of passivation layer 200 exposes contacts 190 and 192.

Figure 10:
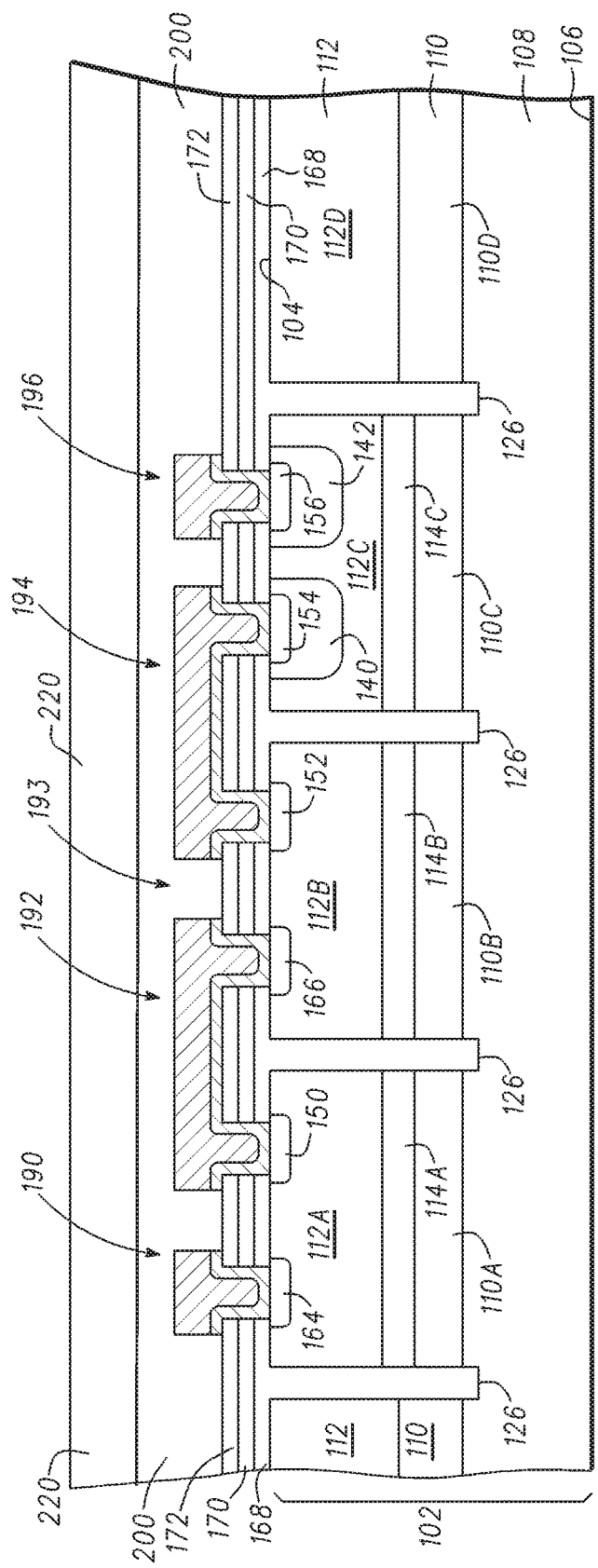
FIG. 10 is a cross-sectional view of the semiconductor component of FIG. 9 at a later stage of manufacture.

Referring now to FIG. 10, masking elements 212 are removed and a photosensitive polyimide layer 220 having a post-cure thickness of at least about 8 µm is formed over dielectric layer 208 and the exposed portions of contacts 190 and 192. By way of example, polyimide layer 220 is dispensed to have a thickness of about 16 µm and then spin coated to have a substantially planar surface and a post-cure thickness of about 10 µm. Suitable photosensitive polyimide materials include photosensitive polyimide sold under the trademark PIMEL from Asahi, HDM polymeric coatings from Hitachi Chemical and DuPont Electronics, polybenzoxazole (PBO), bisbenzocyclobutene (BCB), or the like. It should be noted that layer 200 is not limited to being a photosensitive polyimide but may be a non-photosensitive material that is patterned using photoresist. It should be further noted that the thickness of polyimide layer 246 may be selected to reduce parasitics such as, for example, the parasitic capacitance to the silicon diode and transistor structures, the metal interconnect structures, and the silicon substrate.

Figure 11:
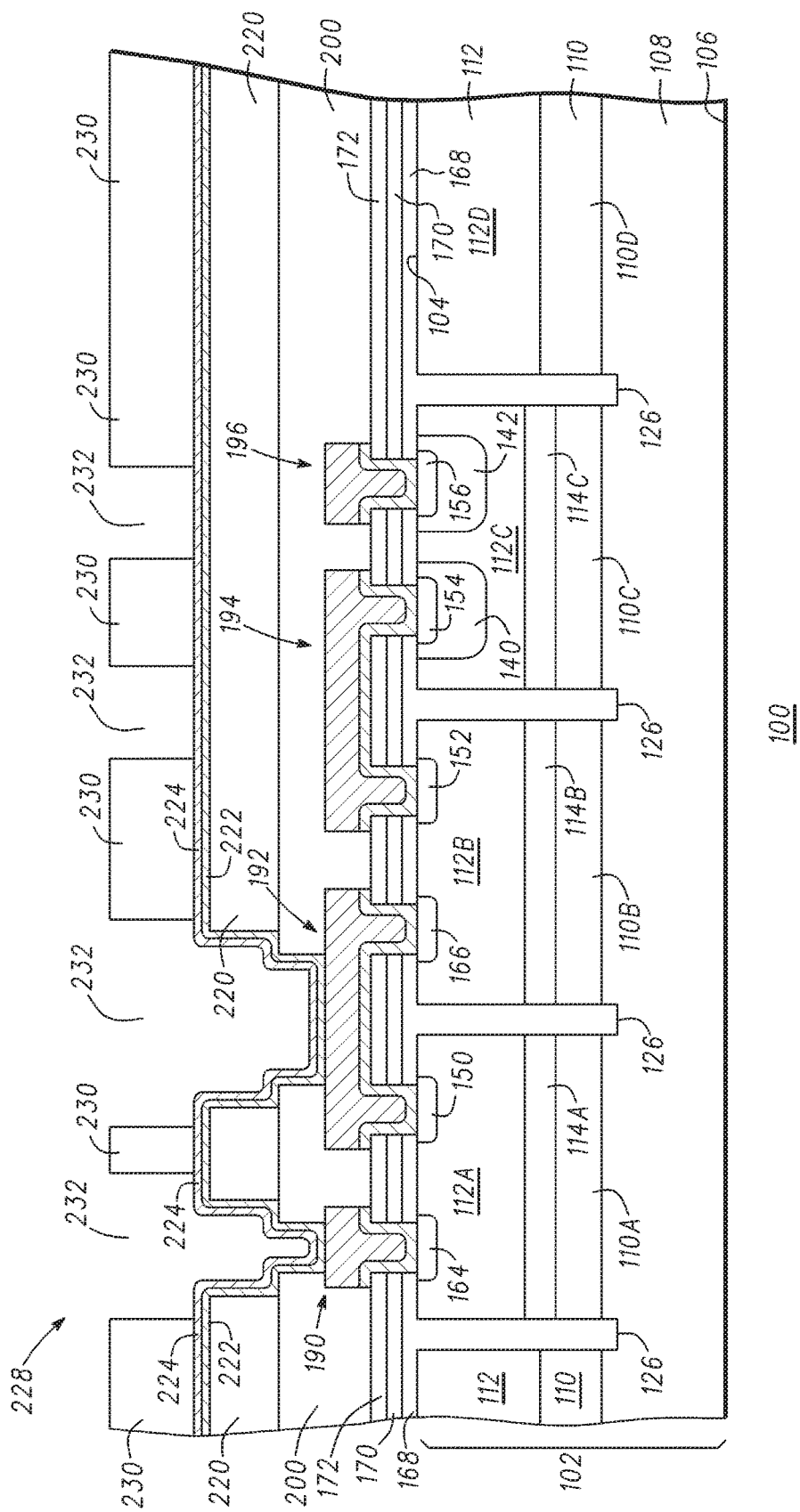
FIG. 11 is a cross-sectional view of the semiconductor component of FIG. 10 at a later stage of manufacture.

Referring now to FIG. 11, portions of polyimide layer 220 above the portions of electrodes 190 and 192 that were exposed through openings in passivation layer 200 are removed by exposure to electromagnetic radiation followed by a develop step. Polyimide layer 220 is cured after removal of the portions exposed to the electromagnetic radiation. Removal of the exposed portions of polyimide layer 220 re-exposes portions of electrodes 190 and 192.

Still referring to FIG. 11, an adhesion layer 222 having a thickness ranging from about 1,500 Å to about 2,500 Å is formed on polyimide layer 220 and on the exposed portions of electrodes 190 and 192. Suitable materials for adhesion layer 222 include titanium tungsten, titanium nitride, titanium, tungsten, platinum, or the like. A copper seed layer 224 having a thickness ranging from about 1,500 Å to about 5,000 Å is formed on adhesion layer 222. By way of example, layers 222 and 224 are each about 2,000 Å thick. A layer of photoresist is formed on copper seed layer 224 and patterned to form a masking structure 228 having masking elements 230 and openings 232. Preferably, the thickness of the photoresist layer is selected to be thicker than the copper to be plated in a subsequent step. By way of example, the thickness of the photoresist layer is about 14 µm.

Figure 12:
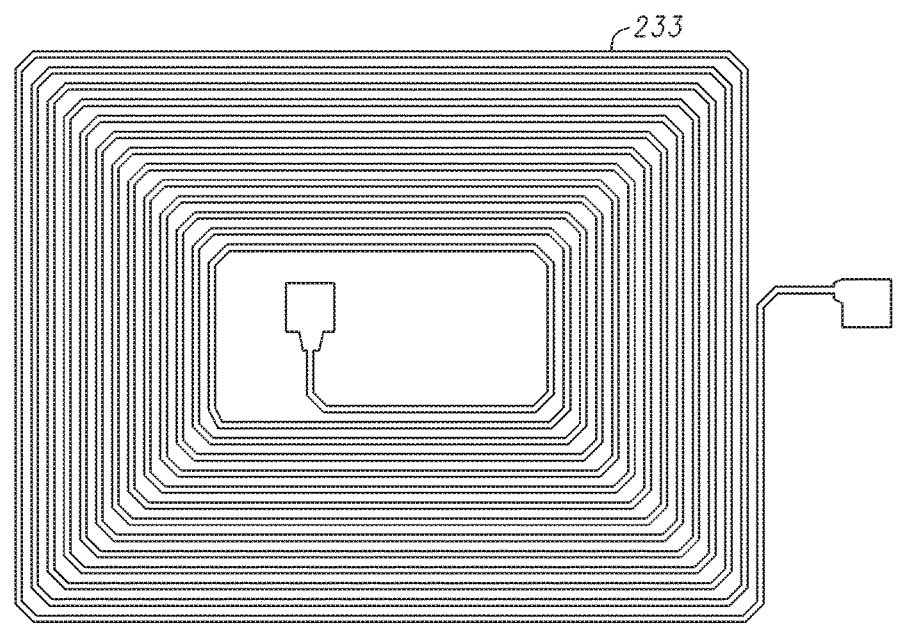
FIG. 12 is a top view of a coil pattern for use in manufacturing the semiconductor component of FIG. 11.

Briefly referring to FIG. 12, a mask 228 having a masking pattern 233 is illustrated for patterning the photoresist layer. Light passes through the dark regions to expose portions of the photoresist layer. The portions of the photoresist layer exposed to light are removed, leaving masking elements 230 and exposing portions of copper seed layer 224.

Figure 13:
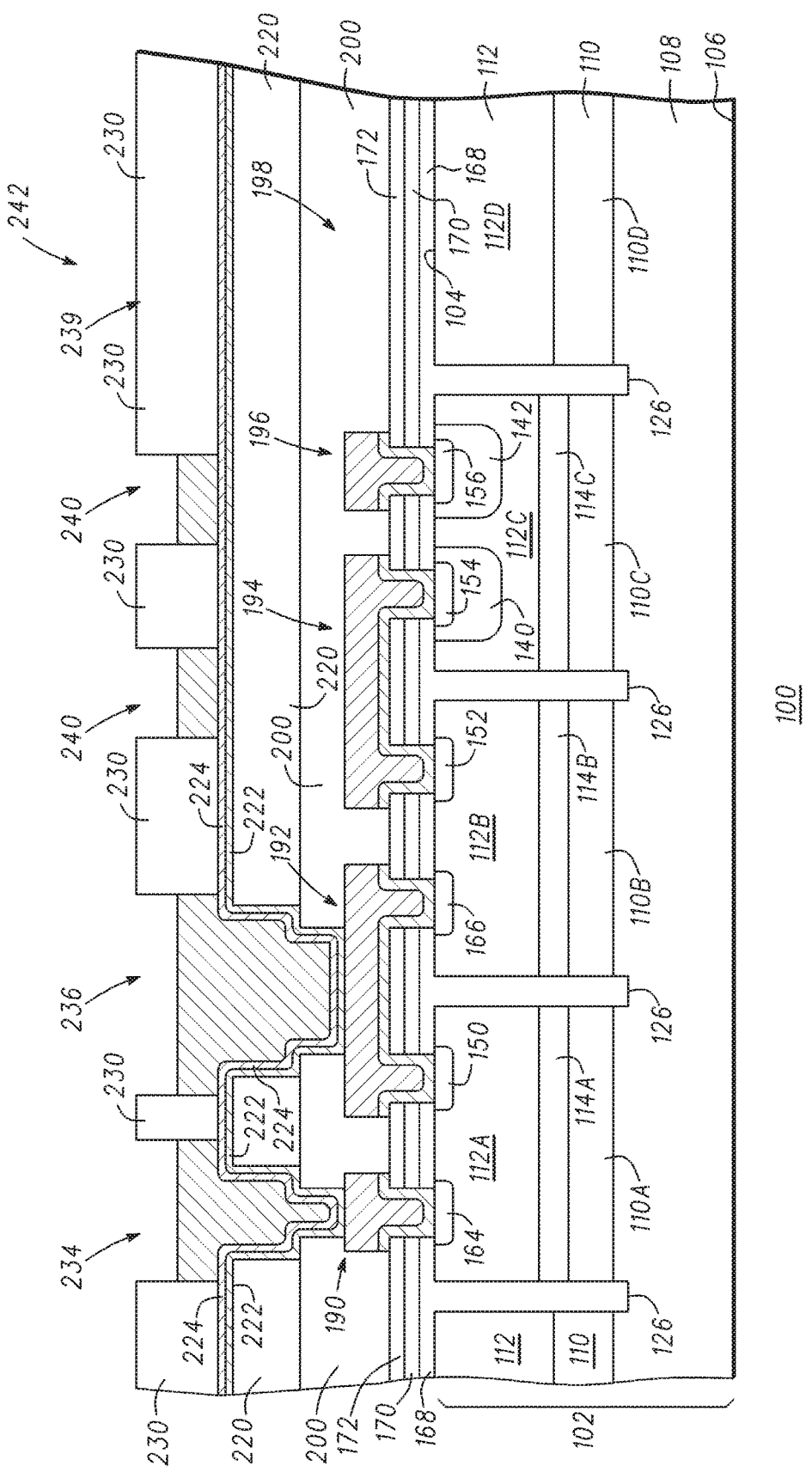
FIG. 13 is a cross-sectional view of the semiconductor component of FIG. 11 at a later stage of manufacture.

Referring now to FIG. 13, copper is plated onto the exposed portions of copper seed layer 224 forming a contact structure 234, a contact structure 236, and windings 240 of a coil or indictor 242.

Figure 14:
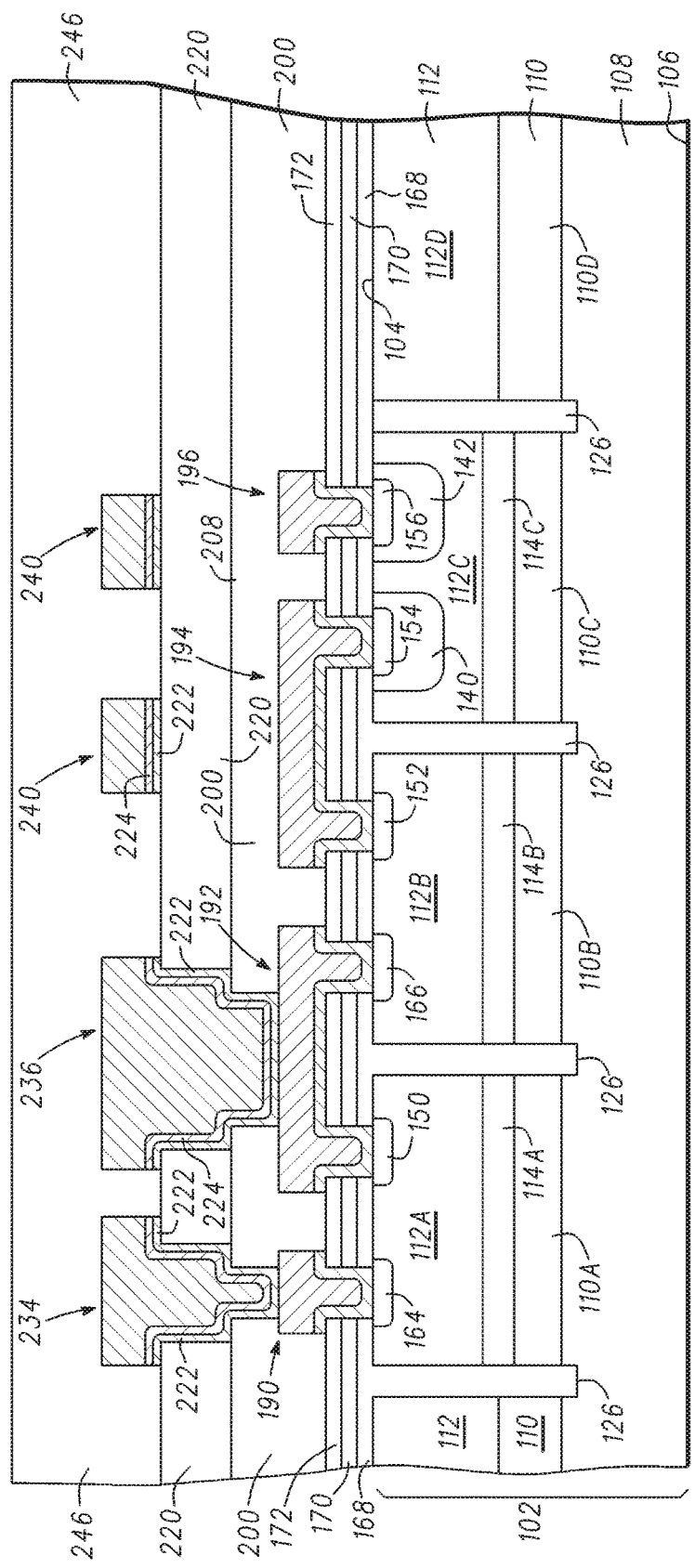
FIG. 14 is a cross-sectional view of the semiconductor component of FIG. 13 at a later stage of manufacture.

Referring now to FIG. 14, masking elements 230 are removed to expose portions of copper seed layer 224 that were protected by masking elements 230. The exposed portions of copper seed layer 224 are removed exposing portions of adhesive layer 222, which are also removed to expose portions of polyimide layer 220. By way of example the portions of copper seed layer 224 and adhesion layer 222 are removed using a wet etch technique.

A layer of photosensitive material 246 having a thickness of at least about 8 µm is formed on the exposed portions of polyimide layer 220, the exposed portions of contact structures 234 and 236, and on windings 240. By way of example, polyimide layer 246 is dispensed to have a thickness of about 16 µm and then spin coated to have a substantially planar surface and a post-cure thickness of about 10 µm. It should be noted that the thickness of polyimide layer 246 is selected to reduce parasitics, e.g., parasitic capacitances, between windings, contact structures 234 and 236, and windings 240, and a copper layer to be plated above polyimide layer 246. Suitable photosensitive polyimide materials have been described with reference to polyimide layer 220.

Figure 15:
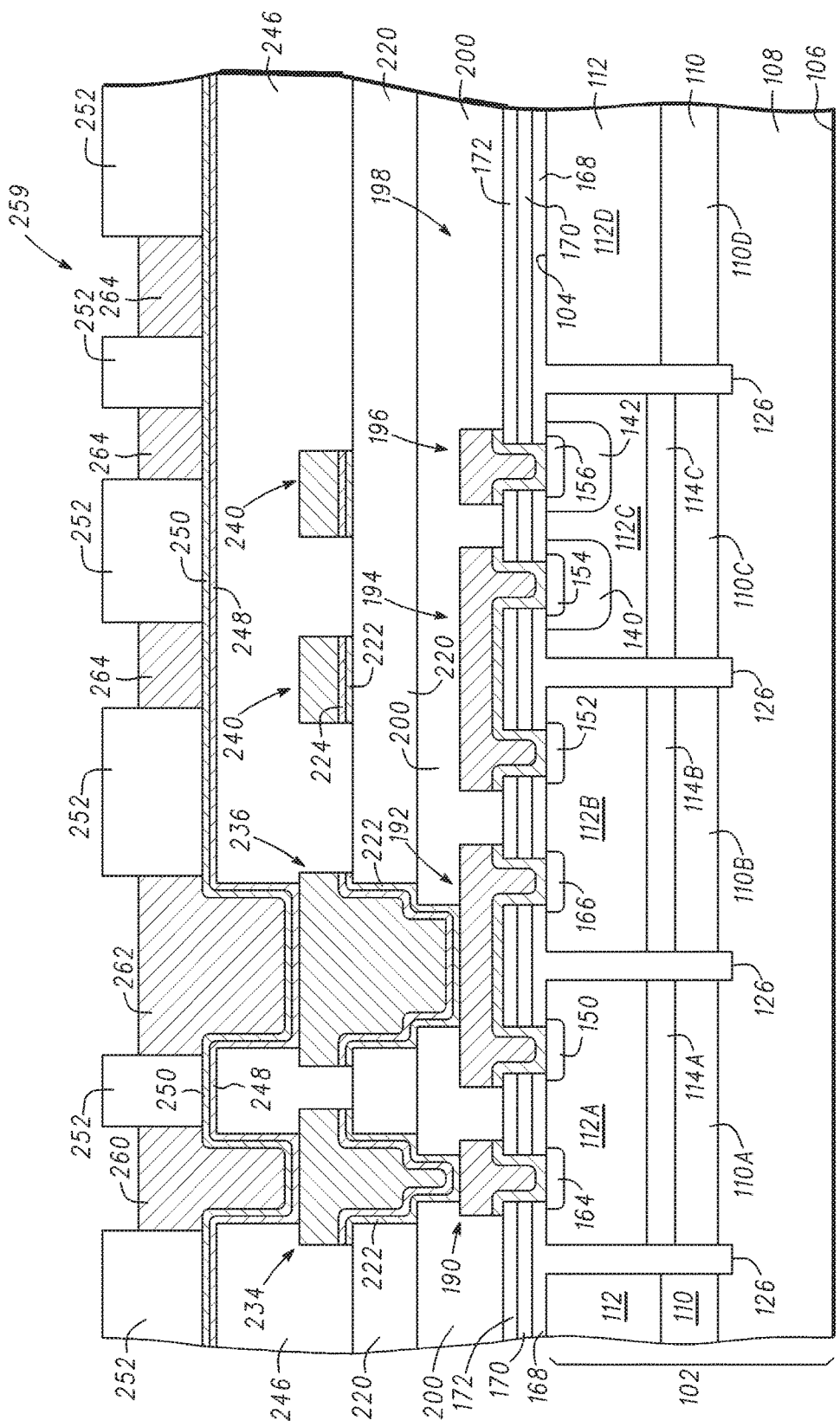
FIG. 15 is a cross-sectional view of the semiconductor component of FIG. 14 at a later stage of manufacture.

Referring now to FIG. 15, portions of polyimide layer 246 above the portions of contact structures 234 and 236 are removed by exposure to electromagnetic radiation followed by a develop step. Polyimide layer 246 is cured after removal of the portions exposed to the electromagnetic radiation. Removal of the exposed portions of polyimide layer 246 exposes portions of contact structures 234 and 236. An adhesion layer 248 having a thickness ranging from about 1,500 Å to about 2,500 Å is formed on polyimide layer 246 and on the exposed portions of contact structures 234 and 236. Suitable materials for adhesion layer 248 include titanium tungsten, titanium nitride, titanium, tungsten, platinum, or the like. A copper seed layer 250 having a thickness ranging from about 1,500 Å to about 5,000 Å is formed on adhesion layer 248. A layer of photoresist is formed on copper seed layer 250. Preferably, the thickness of the photoresist layer is selected to be greater than the thickness of a copper layer to be plated on copper seed layer 250. The thickness of the photoresist layer may range from about 5 µm to about 20 µm and may be, for example, about 14 µm. The photoresist layer is patterned to form masking elements 252 having openings 254 that expose portions of copper seed layer 250. As those skilled in the art will appreciate, the thickness of photoresist layer 216 may be process limited because of line width definition limitations.

Figure 16:
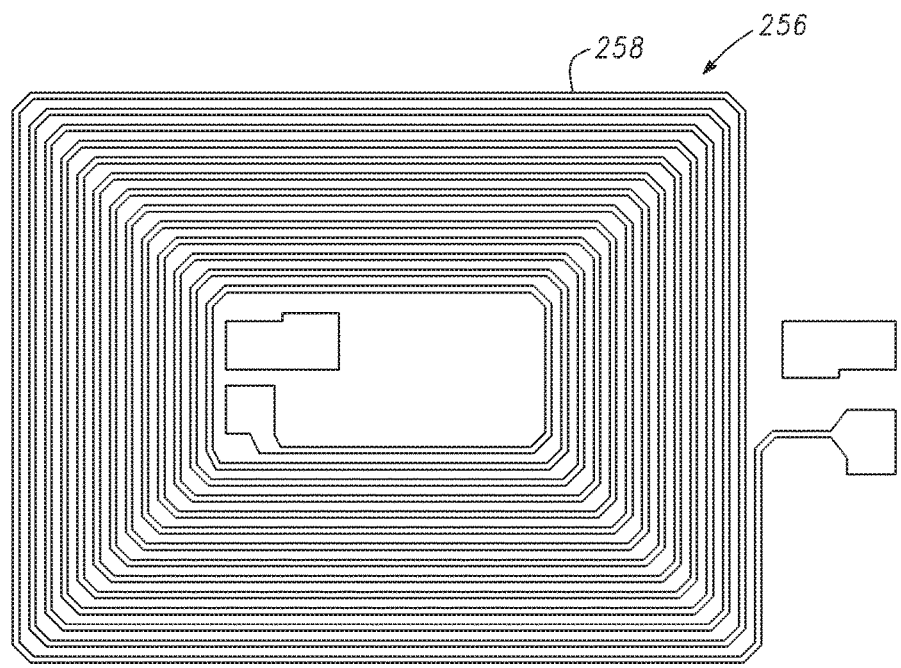
FIG. 16 is a top view of a coil pattern for use in manufacturing the semiconductor component of FIG. 15.

Briefly referring to FIG. 16, a mask 256 having a masking pattern 258 is illustrated for patterning the photoresist layer. Light passes through the dark regions to expose portions of the photoresist layer. The portions of the photoresist layer exposed to light are removed, forming masking elements 252 and openings 254, which openings 254 expose portions of copper seed layer 250.

Referring again to FIG. 15, copper is plated onto the exposed portions of copper seed layer 250 forming a contact structure 260, a contact structure 262, and windings 264 of a coil or inductor 259.

Figure 17:
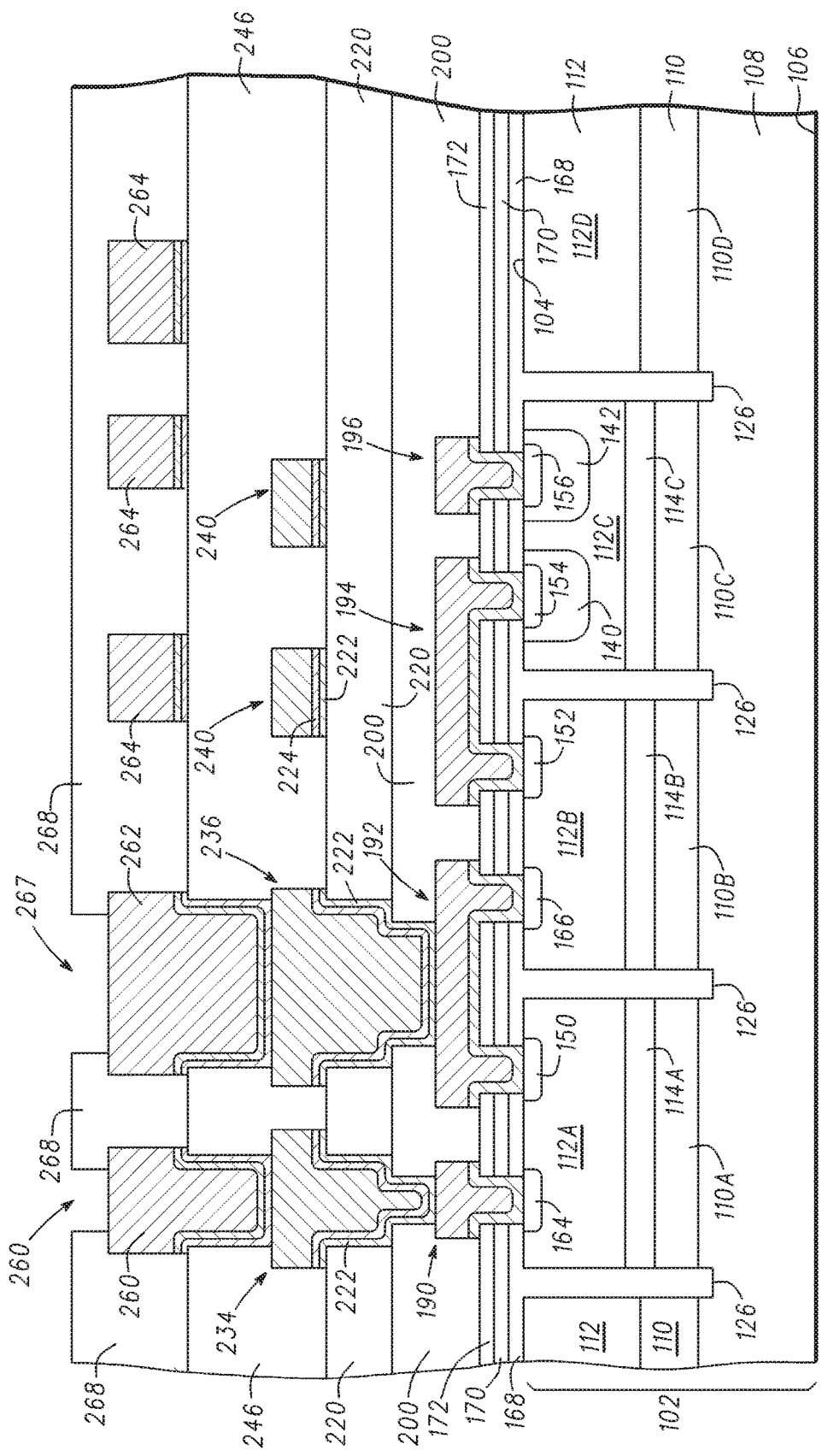
FIG. 17 is a cross-sectional view of the semiconductor component of FIG. 15 at a later stage of manufacture.

Referring now to FIG. 17, masking elements 252 are removed to expose portions of copper seed layer 250 that were protected by masking elements 252. The exposed portions of copper seed layer 250 are removed exposing portions of adhesive layer 248, which are also removed to expose portions of polyimide layer 246. By way of example, the portions of copper seed layer 250 and adhesion layer 248 are removed using a wet etch technique.

A polyimide layer 268 having a post-cure thickness of at least about 8 μm is formed on the exposed portions of polyimide layer 246, the exposed portions of contact structures 260 and 262, and on windings 264. By way of example, polyimide layer 268 is dispensed to have a thickness of about 16 μm and then spin coated to have a substantially planar surface and a post-cure thickness of about 10 μm. It should be noted that the thickness of polyimide layer 268 is selected to form a passivation layer to cover plated the plated copper to prevent oxidation and/or corrosion. Suitable photosensitive polyimide materials have been described with reference to polyimide layer 220. Like layer 220, layer 246 is not limited to being a photosensitive polyimide but may be a non-photosensitive material that is patterned using photoresist.

The portions of polyimide layer 268 above contact structures 260 and 262 are exposed to electromagnetic radiation, developed and removed to expose contact structures 260 and 262.

Figure 18:
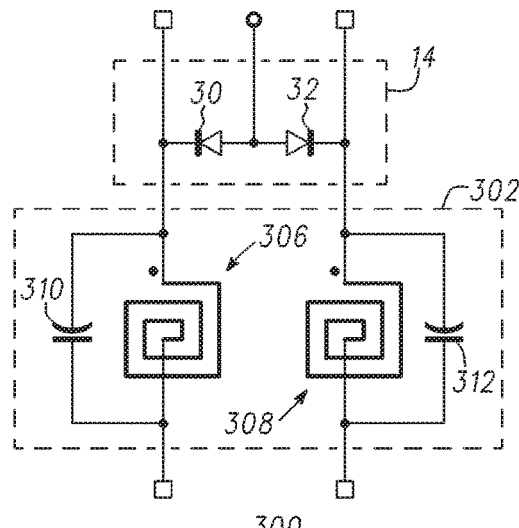
FIG. 18 is a circuit schematic of a semiconductor component in accordance with another embodiment of the present invention.

FIG. 18 is a circuit diagram of a semiconductor component 300 that includes a common mode filter 302 monolithically integrated with a protection device 14. What is shown in FIG. 18 are inductors 306 and 308 and capacitors 310 and 312. Inductor 306 has an input terminal connected to a terminal of capacitor 310 and an output terminal connected to the other terminal of capacitor 310 and inductor 308 has an input terminal connected to a terminal of capacitor 312 and an output terminal connected to the other terminal of capacitor 312. In accordance with an embodiment, protection device 14 includes a diode 30 having a cathode connected to the input terminal of inductor 306 and an anode connected to the anode of a diode 32. The cathode of diode 32 is connected to the input terminal of inductor 308. The commonly connected anodes of diode 30 and 32 may be connected to receive a source of potential such as, for example ground.

Figure 19:
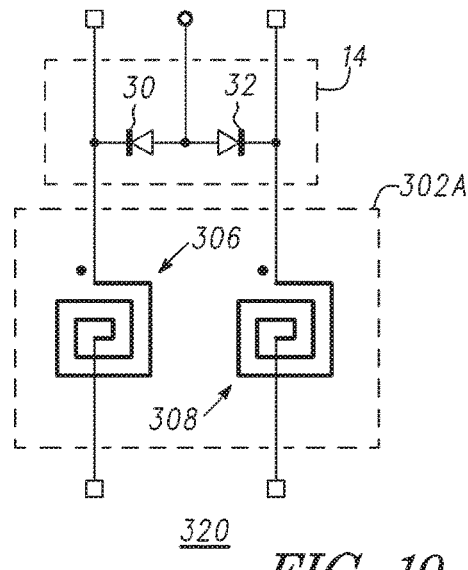
FIG. 19 is a circuit schematic of a semiconductor component in accordance with another embodiment of the present invention.

FIG. 19 is a circuit diagram of a semiconductor component 320 that includes a common mode filter 302A monolithically integrated with a protection device 14. What is shown in FIG. 19 are inductors 306 and 308 connected to protection device 14. In accordance with an embodiment, protection device 14 includes a diode 30 having a cathode connected to the input terminal of inductor 306 and an anode connected to the anode of a diode 32. The cathode of diode 32 is connected to the input terminal of filter 308. The commonly connected anodes of diode 30 and 32 may be connected to receive a source of potential such as, for example ground.

FIG. 20 is a circuit diagram of a semiconductor component 350 that includes a common mode filter 302 monolithically integrated with a protection device 14A. What is shown in FIG. 20 are inductors 306 and 308 and capacitors 310 and 312, which have been described with reference to FIG. 18. Inductor 306 has an input terminal connected to a terminal of capacitor 310 and an output terminal connected to the other terminal of capacitor 310 and inductor 308 has an input terminal connected to a terminal of capacitor 312 and an output terminal connected to the other terminal of capacitor 312.

In accordance with an embodiment, protection device 14A comprises single channel ESD structures 40 and 42. ESD structure 40 comprises diodes 44 and 46 and an npn bipolar transistor 48 and ESD structure 42 comprises diodes 50 and 52 and an npn bipolar transistor 54. Diode 44 has an anode commonly connected to the cathode of diode 46 and to the non-inverting input of common mode filter 350. The collector of npn bipolar transistor 48 is connected to the cathode of diodes 44 and the emitter of npn bipolar transistor 48 is connected to the anodes of diode 46 and 50. Diode 52 has an anode commonly connected to the cathode of diode 50 and to the non-inverting input of common mode filter 350. The collector of npn bipolar transistor 54 is connected to the cathode of diode 52 and the emitter of npn bipolar transistor 54 is connected to the anodes of diodes 46 and 50 and to the emitter of npn bipolar transistor 48.

Figure 21:
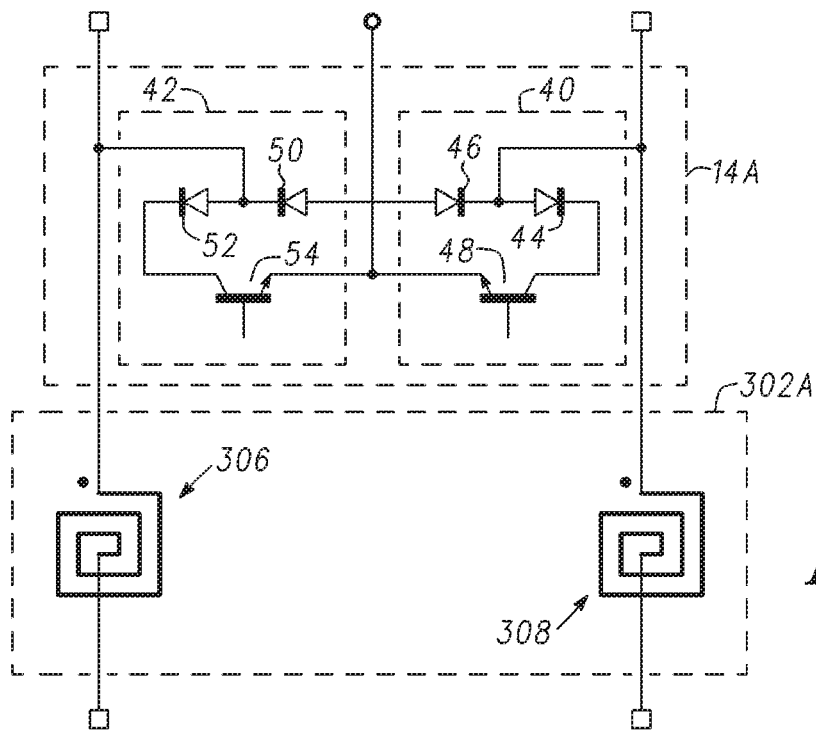
FIG. 21 is a circuit schematic of a semiconductor component in accordance with another embodiment of the present invention.

FIG. 21 is a circuit diagram of a semiconductor component 360 that includes a common mode filter 302A monolithically integrated with a protection device 14A. What is shown in FIG. 21 are inductors 306 and 308 connected to protection device 14A. It should be noted that common mode filter 302A differs from common mode filter 302 in that capacitors 310 and 312 are absent from common mode filter 302A.

Figure 22:
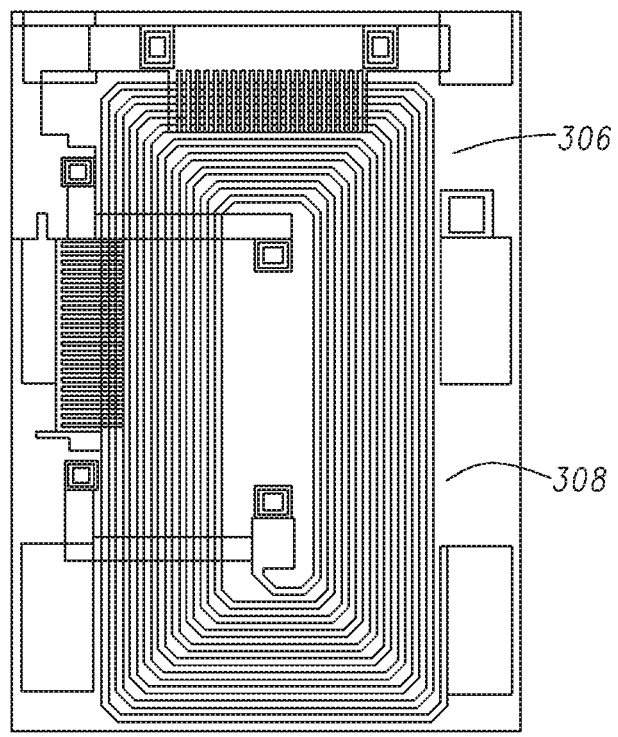
FIG. 22 is a top view of a layout of a semiconductor component in accordance with another embodiment of the present invention.

FIG. 22 is a layout 370 of coil filters such as, for example, coils 306 and 308. Coils 306 and 308 are manufactured over a semiconductor material having a central region and a peripheral region. Coil 306 is formed in a sub-region of the central region and coil 308 is formed in another sub-region of the central region. It should be noted that coils 306 and 308 are configured to be vertically positioned with respect to each other and vertically spaced apart by a dielectric material.

FIG. 23 is a plot 364 of the common mode performance and differential mode performance of a semiconductor component in accordance with embodiments of the present invention. Plot 364 includes a trace 366 of the common mode gain versus frequency and a trace 368 of the differential mode gain versus frequency. Trace 366 includes notches 372 and 374.

FIG. 24 is a plot 376 of ESD clamping performance of a semiconductor component in accordance with embodiments of the present invention in which an ESD event is in the positive direction.

FIG. 25 is a plot 378 of ESD clamping performance of a semiconductor component in accordance with embodiments of the present invention in which an ESD event is in the negative direction.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component having a common mode filter monolithically integrated with a protection device, comprising:

providing a semiconductor material having a major surface and a resistivity of at least 5 ohm-centimeters, the semiconductor material including a first epitaxial layer of a first conductivity type over the semiconductor substrate and a second epitaxial layer of a second conductivity type over the first epitaxial layer and buried layer of the first conductivity type formed from portions of the first and second epitaxial layers;

forming a plurality of trenches in the semiconductor material, wherein forming the plurality of trenches includes forming at least first, second, third, and fourth trenches, wherein a portion of the semiconductor material between the first and second trenches serves as a first device region, a portion of the semiconductor material between the second and third trenches serves as a second device region, and a portion of the semiconductor material between the third and fourth trenches serves as a third device region;

forming the protection device from the semiconductor material between first and second trenches of the plurality of trenches; and monolithically integrating the common mode filter with the protection device.

2. The method of claim 1, further including forming a first diode from the first device region, a second diode from the second device region, and a transistor from the third device region.

3. The method of claim 1, further including:
forming a first and second dopant regions of the second conductivity type in the third device region;
forming third and fourth dopant regions of the second conductivity type in the first and second dopant regions and fifth and sixth dopant regions of the second conductivity type in the first and second device regions, respectively; and
forming seventh and eighth dopant regions of the first conductivity type in the first and second device regions, respectively.

4. The method of claim 1, further including:
forming a first dielectric layer over the semiconductor material, the first dielectric layer configured to magnetically decouple the common mode filter from the protection structure;
forming a first coil of the common mode filter over the first dielectric layer;
forming a second dielectric layer over the first coil and the first dielectric layer; and
forming a second coil over the second dielectric layer, the second dielectric layer configured to magnetically coupled the first coil and the second coil.

5. The method of claim 4, further including forming a third layer of dielectric material over the second coil and the second layer of dielectric material.

6. The method of claim 5, wherein the first, second, and third layers of dielectric material are photosensitive polyimides.

7. A method for manufacturing a semiconductor component having a common mode filter monolithically integrated with a protection device, comprising:
providing a semiconductor material having a major surface and a resistivity of at least 5 ohm-centimeters;
forming a first trench in the semiconductor material, wherein the first trench extends from the major surface into a first portion of the semiconductor material and separates a second portion of the semiconductor material from a third portion of the semiconductor material;

forming a first semiconductor device from the second portion of the semiconductor material;
forming a second semiconductor device from the third portion of the semiconductor material, the sir semiconductor device electrically coupled to the second semiconductor device;
forming a first layer of dielectric material over the major surface; and
forming a first opening in the first layer of dielectric material; and
forming a common mode filter over the semiconductor material, the common mode filter monolithically integrated with the first semiconductor device and having a first coil contact structure electrically contacting the first semiconductor device.

8. The semiconductor component of claim 7, further including:
forming a first dielectric material in the first trench;
forming a first dielectric structure over the major surface of the semiconductor material;
forming first and second openings through the first dielectric structure to expose a first subportion of the first portion of the semiconductor material and a second subportion of the first portion of the semiconductor material;
forming a first contact to the first subportion of the first portion of the semiconductor material and a second contact to the second subportion of the first portion of the semiconductor material; and
forming a passivation layer over the semiconductor material and the first trench;
forming a first layer of material over the passivation layer; and
forming the first coil contact structure of the common mode filter in a first portion of the first layer of material and a first portion of the passivation layer, wherein the first coil contact structure electrically contacts the first contact.

9. The semiconductor component of claim 8, wherein forming the common mode filter comprises:
forming a first contact opening in the passivation layer over the semiconductor material and the first layer of material over the passivation layer, the first contact opening having sides and exposing the first contact;
forming a second contact opening in the passivation layer over the semiconductor material and the first layer of material over the passivation layer, the second contact opening having sides and exposing the second contact;
forming a first metallization structure along the sides of the first contact opening and in contact with the first contact and along the sides of the second contact opening and in contact with the second contact;
forming a first masking structure over the first metallization structure, the first masking structure having a first plurality of openings that expose portions of the first metallization structure; and
forming a first electrically conductive material in the first plurality of openings in the first masking structure, wherein a first portion of the first electrically conductive material in a first opening of the first plurality of openings serves as a first coil contact structure of a first coil of the common mode filter, a second portion of the first electrically conductive material in a second opening of the first plurality of openings serves as a second contact structure of the first coil, and a third portion of the first electrically conductive material in a third opening of the first plurality of openings serves as a first winding of the coil of the common mode filter.

10. The method of claim 9, wherein forming the first layer of material comprises forming a first photosensitive polyimide layer as the first layer of material and forming the first masking layer to be thicker than the first electrically conductive material.

11. The method of claim 9, further including:
removing the first masking structure and portions of the first metallization layer uncovered by removing the first masking structure;
forming a second layer of material over the first contact structure, the second contact structure, and the first winding.

12. The method of claim 11, wherein the second layer of material is a second photosensitive polyimide layer.

13. The method of claim 11, further including:
forming a third contact opening in the second layer of material over the passivation layer, the third contact opening having sides and exposing the first contact structure;
forming a fourth contact opening in the second layer of material over the passivation layer, the third contact opening having sides and exposing the second contact structure;
forming a second metallization structure along the sides of the third contact opening, along the sides of the fourth contact opening and in contact with the first contact structure and the second contact structure;
forming a second masking structure over the second metallization structure, the second masking structure having a second plurality of openings that expose portions of the second layer of material; and
forming a second electrically conductive material in the second plurality of openings in the second masking structure, wherein a first portion of the second electrically conductive material in a first opening of the second plurality of openings serves as a third contact structure of a first coil of the common mode filter, a second portion of the second electrically conductive material in a second opening of the plurality of openings serves as a fourth contact structure of the first coil, and a third portion of the second electrically conductive material in a third opening of the plurality of openings serves as a second winding of the coil of the common mode filter.

14. The method of claim 13, further including:
removing the second masking structure and portions of the second metallization structure uncovered by the second electrically conductive material;
forming a third layer of material over the third contact structure, the fourth contact structure, and the second winding, the second layer of material having a first opening that exposes the third contact structure and a second opening that exposes the fourth contact structure.

15. A method for manufacturing a semiconductor component having a common mode filter monolithically integrated with a protection device, comprising:
providing a semiconductor material of a first conductivity type and having a major surface and a resistivity of at least 5 ohm-centimeters;
forming a first trench in the semiconductor material, wherein the first trench extends from the major surface into a first portion of the semiconductor material and separates a second portion of the semiconductor material from a third portion of the semiconductor material;
forming a second trench in the semiconductor material, wherein the second trench extends from the major surface into a fourth portion of the semiconductor material and separates the third portion of the semiconductor material from a fifth portion of the semiconductor material;
forming a third trench in the semiconductor material, wherein the third trench extends from the major surface into a sixth portion of the semiconductor material and separates the fifth portion of the semiconductor material from a seventh portion of the semiconductor material;
forming a first semiconductor device from the second portion of the semiconductor material;
forming a second semiconductor device from the third portion of the semiconductor material, the second semiconductor device electrically coupled to the first semiconductor device;
forming a third semiconductor device from the fifth portion of the semiconductor material, the third semiconductor device electrically coupled to the second semiconductor device;
forming a first layer of dielectric material over the major surface; and
forming a first opening in the first layer of dielectric material and a second opening in the first layer of dielectric material; and
forming a common mode filter over the semiconductor material, the common mode filter monolithically integrated with the first semiconductor device, the second semiconductor device, and the third semiconductor device and having a first coil contact structure electrically contacting the first semiconductor device and a second coil contact structure electrically contacting the second semiconductor device.

16. The method of claim 15, further including:
forming a first dielectric material in the first trench, the second trench, and the third trench;
forming a first dielectric structure over the major surface of the semiconductor material;
forming first, second, third, fourth, fifth, and sixth openings through the first dielectric structure, wherein the first opening exposes a first subportion of the second portion of the semiconductor material, the second opening exposes a second subportion of the second portion of the semiconductor material, the third opening exposes a first subportion of the third portion of the semiconductor material, the fourth opening exposes a second subportion of the third portion of the semiconductor material, the fifth opening exposes a first subportion of the fifth portion of the semiconductor material, and the sixth opening exposes a second subportion of the fifth portion of the semiconductor material;
forming a first contact to the first subportion of the second portion of the semiconductor material, a second contact to the second subportion of the second portion of the semiconductor material, a third contact to the first subportion of the third portion of the semiconductor material, a fourth contact to the second subportion of the third portion of the semiconductor material, a fifth contact to the first subportion of the fifth portion of the semiconductor material, and a sixth contact to the second subportion of the fifth portion of the semiconductor material;
forming a passivation layer over the semiconductor material and the first trench, the second trench, and the third trench;

forming a first layer of material over the passivation layer; and forming the first coil contact structure of the common mode filter in a first portion of the first layer of material and a first portion of the passivation layer, wherein the first coil contact structure electrically contacts the first contact.

17. The method of claim 16, wherein forming the first semiconductor device comprises forming a first dopant region of the first conductivity type in the first subportion of the second portion of the semiconductor material and a second dopant region of a second conductivity type in the second subportion of the second portion of the semiconductor material, wherein the first dopant region serves as an anode of the first semiconductor device and the second dopant region serves as a cathode of the second semiconductor device;

forming the second semiconductor device comprises forming a third dopant region of the first conductivity type in the first subportion of the third portion of the semiconductor material and a fourth dopant region of the second conductivity type in the second subportion of the third portion of the semiconductor material, wherein the third dopant region serves as an anode of the first semiconductor device and the second dopant region serves as a cathode of the second semiconductor device;

forming the third semiconductor device comprises forming a fifth dopant region of the first conductivity in a third subportion of the fifth portion of the semiconductor material, forming a sixth dopant region of the first conductivity type in a fourth subportion of the fifth portion of the semiconductor material; forming a seventh dopant region of the second conductivity type in the first subportion of the fifth portion of the semiconductor material, and forming an eighth dopant region of the second conductivity type in the second subportion of the fifth portion of the semiconductor material, wherein the seventh dopant region serves as a collector of a transistor and the eighth dopant region serves as an emitter of a transistor; and further including forming an electrically conductive material that electrically couples the second contact with the third contact.

* * * * *